(12) United States Patent
Park et al.

(10) Patent No.: US 10,790,551 B2
(45) Date of Patent: Sep. 29, 2020

(54) METHOD AND ELECTRONIC DEVICE FOR DETECTING BATTERY SWELLING

(71) Applicant: Samsung Electronics Co., Ltd., Gyeonggi-do (KR)

(72) Inventors: Junghui Park, Gyeongsangbuk-do (KR); Sungjun Kim, Daegu (KR)

(73) Assignee: Samsung Electronics Co., Ltd., Yeongtong-gu, Suwon-si, Gyeonggi-do (KR)

(*) Notice: Subject to any disclaimer, the term of this patent is extended or adjusted under 35 U.S.C. 154(b) by 117 days.

(21) Appl. No.: 16/124,351

(22) Filed: Sep. 7, 2018

(65) Prior Publication Data

US 2019/0097278 A1    Mar. 28, 2019

(30) Foreign Application Priority Data

Sep. 22, 2017 (KR) ........................ 10-2017-0122488

(51) Int. Cl.
*H01M 10/48* (2006.01)
*H01M 10/42* (2006.01)
(Continued)

(52) U.S. Cl.
CPC .............. *H01M 10/48* (2013.01); *G01B 7/16* (2013.01); *G01R 25/00* (2013.01);
(Continued)

(58) Field of Classification Search
CPC combination set(s) only.
See application file for complete search history.

(56) References Cited

U.S. PATENT DOCUMENTS

| 5,680,029 A | 10/1997 | Smits et al. |
| 9,444,425 B2 | 9/2016 | Mow et al. |

(Continued)

FOREIGN PATENT DOCUMENTS

| CN | 101855747 A | 10/2010 |
| JP | 10-502767 A | 3/1998 |

(Continued)

OTHER PUBLICATIONS

International Search Report dated Dec. 20, 2018.

*Primary Examiner* — Kaity V Chandler
(74) *Attorney, Agent, or Firm* — Cha & Reiter, LLC.

(57) ABSTRACT

The present disclosure relates to a method and an electronic device for detecting a battery swelling. The device may include: a housing including a front plate, and a back plate facing away from and spaced from the front plate; a battery including a first surface facing the front plate and a second surface facing the back plate; a first layer including a conductive pattern parallel to the back plate, wherein at least a portion of the conductive pattern is interposed between the second surface of the battery and the back plate and a circuit electrically connected to a first point and a second point of the conductive pattern, and configured to transmit a signal to the first point and receive the signal from the second point; and further configured to: detect a phase difference between the transmitted signal and the received signal, and determine whether the battery is swollen based on the phase difference. The present disclosure may further include various other embodiments.

20 Claims, 21 Drawing Sheets

(51) Int. Cl.
*G01R 25/00* (2006.01)
*G01B 7/16* (2006.01)
*H04B 5/00* (2006.01)
H02J 7/02 (2016.01)
H01F 27/40 (2006.01)
H02J 7/00 (2006.01)
H01F 38/14 (2006.01)
H02J 50/10 (2016.01)

(52) U.S. Cl.
CPC ........ *H01M 10/425* (2013.01); *H04B 5/0037* (2013.01); *H01F 27/402* (2013.01); *H01F 38/14* (2013.01); *H01F 2027/406* (2013.01); *H01M 2010/4271* (2013.01); *H01M 2010/4278* (2013.01); *H02J 7/0029* (2013.01); *H02J 7/00034* (2020.01); *H02J 7/025* (2013.01); *H02J 50/10* (2016.02)

(56) References Cited

U.S. PATENT DOCUMENTS

| | | |
|---|---|---|
| 2010/0247980 A1 | 9/2010 | Jang et al. |
| 2016/0116548 A1 | 4/2016 | Ghantous et al. |
| 2017/0331160 A1* | 11/2017 | Mensah-Brown .... H02J 7/0029 |
| 2018/0006342 A1 | 1/2018 | Lee et al. |
| 2018/0287224 A1* | 10/2018 | Ryoo ................. G01N 29/2468 |

FOREIGN PATENT DOCUMENTS

| | | |
|---|---|---|
| KR | 10-1262879 B1 | 5/2013 |
| KR | 10-1392142 B1 | 4/2014 |
| KR | 10-2016-0145428 A | 12/2016 |
| KR | 10-1761537 B1 | 7/2017 |

* cited by examiner

METHOD AND ELECTRONIC DEVICE FOR DETECTING BATTERY SWELLING

CROSS-REFERENCE TO RELATED APPLICATION(S)

This application is based on and claims priority under 35 U.S.C. § 119 to Korean Patent Application No. 10-2017-0122488, filed on Sep. 22, 2017, in the Korean Intellectual Property Office, the disclosure of which is incorporated by reference herein in its entirety.

BACKGROUND

Field

Various embodiments of the present disclosure relate to a method and an electronic device for detecting a battery swelling.

Description of Related Art

In recent years, demand for batteries has been increasing due to an increase in demand for portable electronic devices. A lithium ion battery among the batteries has been widely used due to advantages such as high energy density, high discharge voltage, and output stability.

SUMMARY

It is important in the field of batteries is to improve safety.

In a lithium ion battery, which is mainly used in a portable electronic device in general, battery swelling may occur due to number of conditions. These conditions include shock caused by an internal short-circuit, a charge state exceeding an allowable current or voltage, exposure to a high temperature, a fall, an extreme change in external air pressure or the like.

The battery swelling may cause ignition, or even explosion, of the battery pack, so measures to prevent safety accidents may be required.

Accordingly, various embodiments of the present disclosure are directed to a method and an electronic device capable of preventing the safety accidents due to the ignition, or explosion, etc. of the battery pack by detecting the battery swelling in advance.

According to various embodiments of the disclosure, an electronic device includes: a housing including a front plate, and a back plate facing away from and spaced from the front plate; a battery including a first surface facing the front plate and a second surface facing the back plate; a first layer including a conductive pattern parallel to the back plate, wherein at least a portion of the conductive pattern is interposed between the second surface of the battery and the back plate and a circuit electrically connected to a first point and a second point of the conductive pattern, and configured to transmit a signal to the first point and receive the signal from the second point; and further configured to: detect a phase difference between the transmitted signal and the received signal, and determine whether the battery is swollen based on the phase difference.

According to another embodiments of the disclosure, there is a method in an electronic device for detecting a battery swelling. The electronic device may include a housing including a front plate and a back plate facing away from and spaced from the front plate, a battery including a first surface facing the front plate and a second surface facing the back plate, a first layer including a conductive pattern parallel to the back plate and a circuit electrically connected to a first point and a second point of the conductive pattern, and configured to transmit a signal to the first point and receive the signal from the second point. The method may include the following operations performed by the circuit: comparing a phase of a signal transmitted to the first point with the phase of the signal received from the second point; and determining whether the battery is swollen based on the phase difference.

According to another embodiment, there is a non-transitory recording medium, wherein a program for controlling an operation of an electronic device is recorded. The electronic device may include a housing including a front plate and a back plate facing away from and spaced from the front plate, a battery including a first surface facing the front plate and a second surface facing the back plate, a first layer including a conductive pattern parallel to the back plate, and a circuit electrically connected to a first point and a second point of the conductive pattern, and configured to transmit a signal to the first point and receive the signal from the second point. The non-transitory recording medium may store a program which allows the circuit to perform the following operations: comparing a phase of a signal transmitted to the first point with the phase of the signal received from the second point; and determining whether the battery is swollen based on the phase difference.

Various embodiments of the present disclosure are directed to the provision of a method and an electronic device capable of preventing safety accidents due to ignition, explosion, etc, of the battery pack by detecting the battery swelling in advance.

The effects that may be achieved by the embodiments of the present disclosure are not limited to the above-mentioned objects. That is, other effects that are not mentioned may be obviously understood by those skilled in the art to which the present disclosure pertains from the following description.

DETAILED DESCRIPTION

Figure 1:
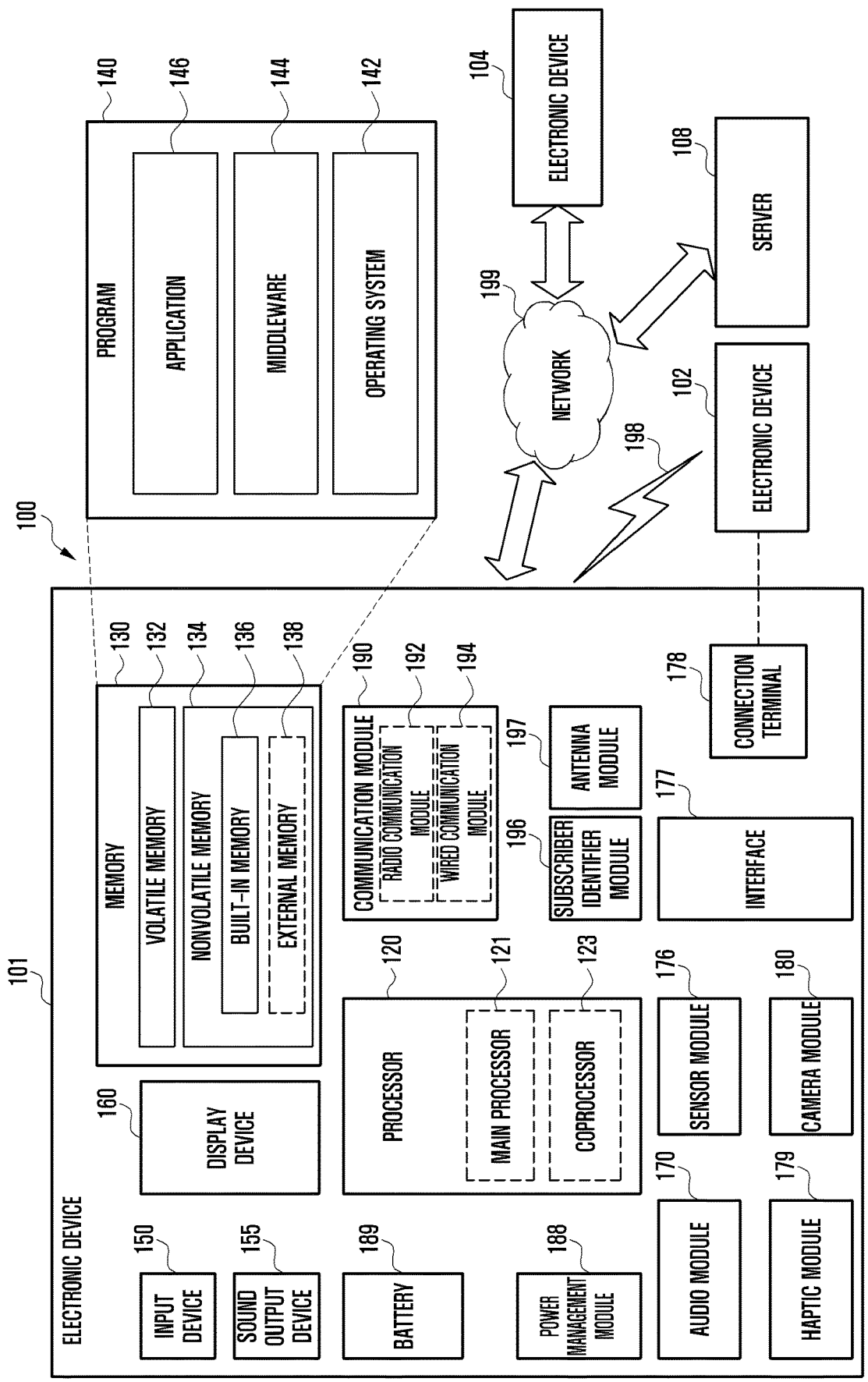
FIG. 1 is a block diagram illustrating an electronic device in a network environment according to various embodiments of the present disclosure.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell. According to various embodiments of the present disclosure, battery swelling of the battery is detected.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
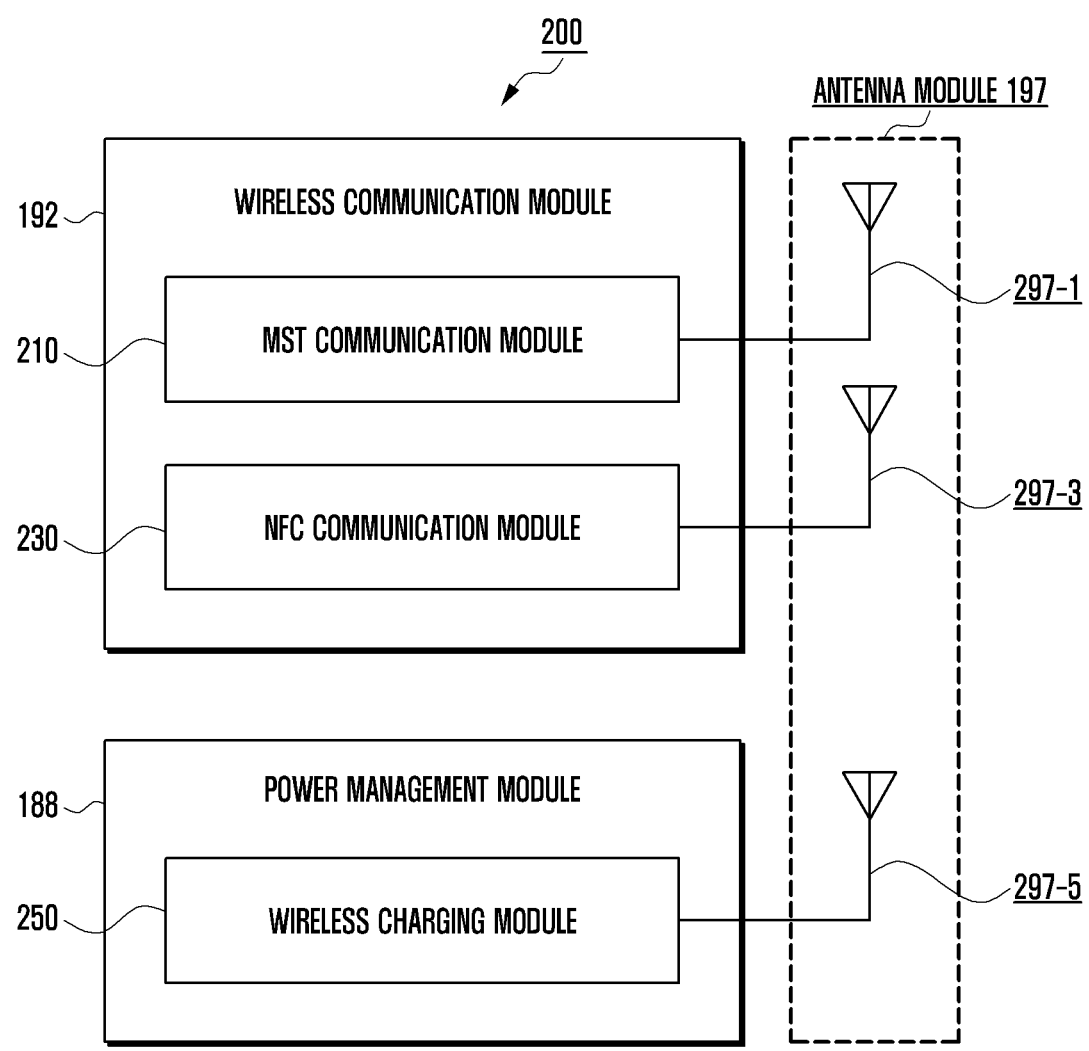
FIG. 2 is a block diagram illustrating a wireless communication module, a power management module and an antenna module of the electronic device according to various embodiments of the present disclosure.

FIG. 2 is a block diagram 200 illustrating the wireless communication module 192, the power management module 188, and the antenna module 197 of the electronic device 101 according to various embodiments. Referring to FIG. 2, the wireless communication module 192 may include a magnetic secure transmission (MST) communication module 210 or a near-field communication (NFC) module 230, and the power management module 188 may include a wireless charging module 250.

In such a case, the antenna module 197 may include a plurality of antennas that include a MST antenna 297-1 connected with the MST communication module 210, a NFC antenna 297-3 connected with the NFC communication module 230, and a wireless charging antenna 297-5 connected with the wireless charging module 250. For ease of description, the same components as those described in regard to FIG. 1 are briefly described or omitted from the description.

According to various embodiments of the present disclosure, the NFC communication module or wireless charging module 250 may form a portion of conductive pattern. The conductive pattern can be connected at two points to a circuit that is configured to determine whether a battery (e.g., FIG. 1, battery 189) is swollen, by detecting a phase different between a transmitted signal and a received signal.

The MST communication module 210 may receive a signal containing control information or payment information such as card information from the processor 120, generate a magnetic signal corresponding to the received signal, and then transfer the generated magnetic signal to the external electronic device 102 (e.g., a point-of-sale (POS) device) via the MST antenna 297-1. To generate the magnetic signal, according to an embodiment, the MST communication module 210 may include a switching module (not shown) that includes one or more switches connected with the MST antenna 297-1, and control the switching module to change the direction of voltage or current supplied to the MST antenna 297-1 according to the received signal. The change of the direction of the voltage or current allows the direction of the magnetic signal (e.g., a magnetic field) emitted from the MST antenna 297-1 to change accordingly. If detected at the external electronic device 102, the magnetic signal with its direction changing may cause an effect (e.g., a waveform) similar to that of a magnetic field that is generated when a magnetic card corresponding to the card information associated with the received signal is swiped through a card reader of the electronic device 102. According to an embodiment, for example, payment-related information and a control signal that are received by the electronic device 102 in the form of the magnetic signal may be further transmitted to an external server 108 (e.g., a payment server) via the network 199.

The NFC communication module 230 may obtain a signal containing control information or payment information such as card information from the processor 120 and transmit the obtained signal to the external electronic device 102 via the NFC antenna 297-3. According to an embodiment, the NFC communication module 230 may receive such a signal transmitted from the external electronic device 102 via the NFC antenna 297-3.

The wireless charging module 250 may wirelessly transmit power to the external electronic device 102 (e.g., a cellular phone or wearable device) via the wireless charging antenna 297-5, or wirelessly receive power from the external electronic device 102 (e.g., a wireless charging device). The wireless charging module 250 may support one or more of various wireless charging schemes including, for example, a magnetic resonance scheme or a magnetic induction scheme.

According to an embodiment, some of the MST antenna 297-1, the NFC antenna 297-3, or the wireless charging antenna 297-5 may share at least part of their radiators. For example, the radiator of the MST antenna 297-1 may be used as the radiator of the NFC antenna 297-3 or the wireless charging antenna 297-5, or vice versa. In such a case, the antenna module 197 may include a switching circuit (not shown) adapted to selectively connect (e.g., close) or disconnect (e.g. open) at least part of the antennas 297-1, 297-3, or 297-5, for example, under the control of the wireless communication module 192 (e.g., the MST communication module 210 or the NFC communication module 230) or the power management module (e.g., the wireless charging module 250). For example, when the electronic device 101 uses a wireless charging function, the NFC communication module 230 or the wireless charging module 250 may control the switching circuit to temporarily disconnect at least one portion of the radiators shared by the NFC antenna 297-3 and the wireless charging antenna 297-5 from the NFC antenna 297-3 and to connect the at least one portion of the radiators with the wireless charging antenna 297-5.

According to an embodiment, at least one function of the MST communication module 210, the NFC communication module 230, or the wireless charging module 250 may be controlled by an external processor (e.g., the processor 120). According to an embodiment, at least one specified function (e.g., a payment function) of the MST communication module 210 or the NFC communication module 230 may be performed in a trusted execution environment (TEE). According to an embodiment, the TEE may form an execution environment in which, for example, at least some designated area of the memory 130 is allocated to be used for performing a function (e.g., a financial transaction or personal information-related function) that requires a relatively high level of security. In such a case, access to the at least some designated area of the memory 130 may be restrictively permitted, for example, according to an entity accessing thereto or an application being executed in the TEE.

Overview

Turning now to FIGS. 3-7, an electronic device (e.g., 300) according to various embodiments of the present disclosure may include: a housing (e.g., 320) including a front plate (e.g., 310), and a back plate (e.g., 330) facing away from and spaced from the front plate 310; a battery (e.g., FIG. 5B, 540) including a first surface facing the front plate 310 and a second surface facing the back plate 330; a first layer including a conductive pattern (e.g., 552) parallel to the back plate 330, wherein at least a portion of the conductive pattern 552 is interposed between the second surface of the battery 540 and the back plate 330; a circuit (e.g., 710) electrically connected to a first point (e.g., Tx1 in FIG. 7) and a second point (e.g., Tx2 in FIG. 7) of the conductive pattern 552, and configured to transmit a signal to the first point Tx1 and receive the signal from the second point Tx2; and further configured to: detect a phase difference between the transmitted signal and the received signal, and determine whether the battery 540 is swollen based on the phase difference; a second layer interposed between the first layer and the second surface of the battery 540; and a third layer interposed between and contacting the first layer and the second layer. The conductive pattern 552 may include a coil wound around an axis perpendicular to the first layer such as an NFC Coil. The circuit 710 may also transmit or receive at least one of the magnetic signal, an NFC signal, or a wireless charging signal, using the conductive pattern 552. The first layer may include a flexible printed circuit board (FPCB). The second layer may include graphite. The third layer may include a compound including iron (Fe). The conductive pattern 552 may be positioned to overlap the battery 540. The circuit 710 may generate an n-bit digital value based on a result of comparing a phase of the signal transmitted to the first point Tx1 with the phase of the signal received from the second point Tx2; calculate a phasor value from the n-bit digital value; and determine that the battery 540 is swollen when the calculated phasor value is different from a pre-stored reference phasor value. The circuit 710 may terminate a drive when a display of the electronic device 500 is in an off state. The circuit 710 may detect a temperature of the electronic device 500, and correct the phase of the signal received from the second point Tx2 based on the temperature of the electronic device 500, when the temperature of the electronic device 500 is out of a reference range.

The Housing

Figure 3:
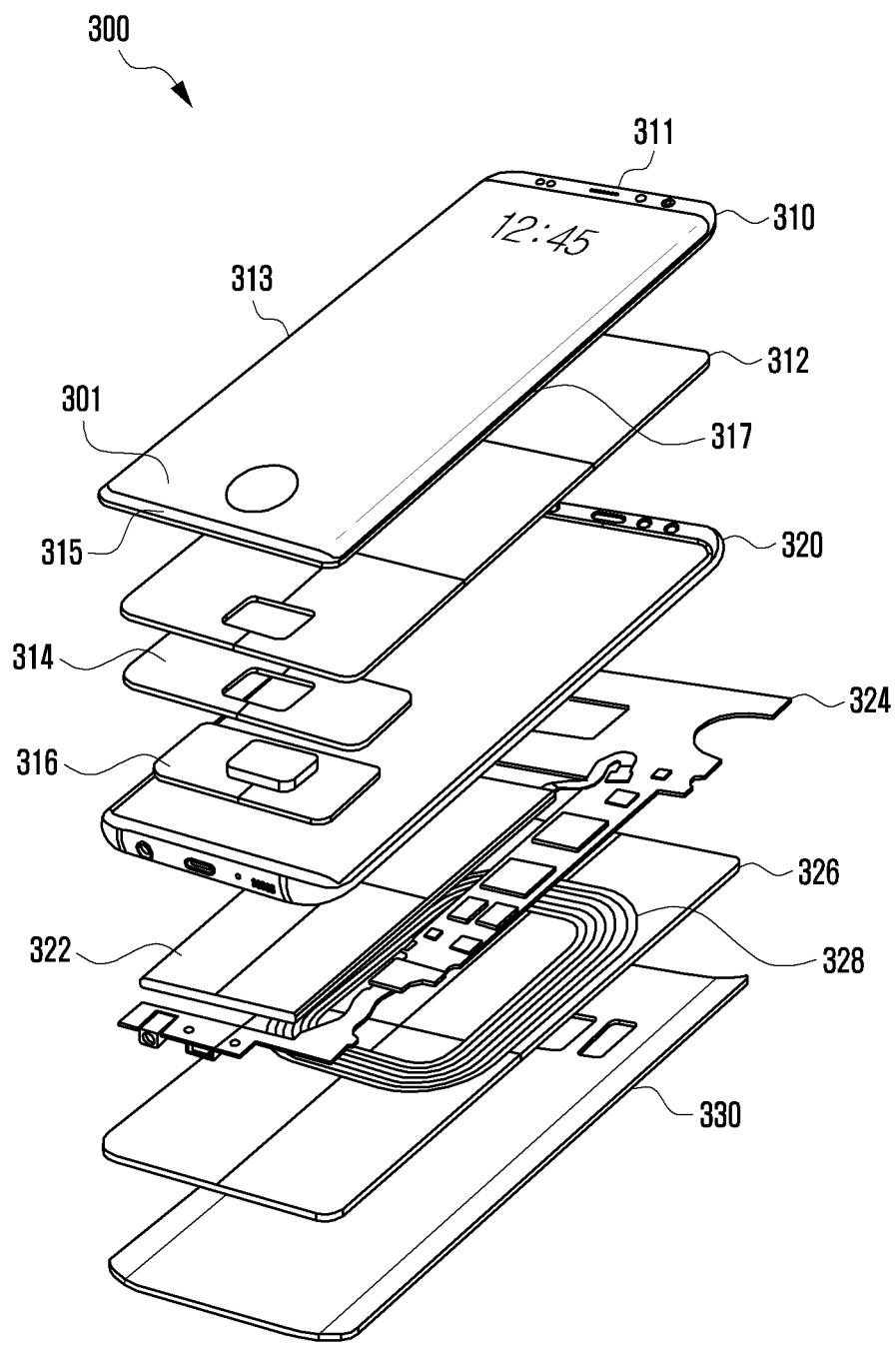
FIG. 3 is a schematic diagram illustrating a configuration of the electronic device according to various embodiments of the present disclosure.

FIG. 3 is a schematic view illustrating a configuration of an electronic device 300 according to various embodiments of the present disclosure. The electronic device includes the housing 320, front plate 310, back plate 330, battery 322, and first layer 326 with a conductive pattern 328. Referring to FIG. 3, an electronic device 300 according to various embodiments of the present disclosure may include a front plate 310, a digitizer panel 312, a force touch panel 314, a biometric sensor 316 (e.g., a fingerprint sensor), the housing 320, a battery 322, a printed circuit board (PCB) 324, a flexible printed circuit board (FPCB) 326, a wireless charging coil 328, or a back plate 330.

According to various embodiments, the front plate 310, the digitizer panel 312, the force touch panel 314, and the biometric sensor 316 (e.g., the fingerprint sensor) may be positioned above the housing 320. The battery 22, the PCB 324, the FPCB 326 (which can be the first layer 326), the wireless charging coil 328 (which can be the conductive pattern) and the back plate 330 may be positioned below the housing 320. According to an embodiment, the electronic device 300 may omit at least one of the components described above, or add other components. According to an embodiment, the electronic device 300 may utilize an externally exposed surface of the housing 320 as at least a portion of the antenna. According to various embodiments, the electronic device 300 may include, for example, at least some of the electronic devices 101, 102 and 104 in FIG. 1.

Front Plate

According to an embodiment, the front plate 310 may be, for example, a cover forming the front surface of the electronic device 300. The front plate 310 may have a rectangular shape when viewed from above. According to an embodiment, the front plate 310 may have a first peripheral portion 311 having a first length and extending in a first direction, a second peripheral portion 313 having a second length longer than the first length and extending in a second direction substantially perpendicular to the first direction, a third peripheral portion 315 having the first length and extending parallel to the first peripheral portion, and a fourth peripheral portion 317 having the second length and extending in parallel to the second peripheral portion. According to an embodiment, the front plate 310 may expose a touch screen display 301 through at least a part thereof.

According to an embodiment, the touch screen display 301 may display an image. For example, the touch screen display 301 may perform an input function and a display function. According to an embodiment, the touch screen display 301 may include a touch panel and a display. According to various embodiments, the touch screen display 301 may include a display 160 in FIG. 1.

According to an embodiment, the digitizer panel 312 may receive an X coordinate and a Y coordinate for a user touch input through the touch screen display 301.

According to an embodiment, the force touch panel 314 may detect a touch pressure input through the touch screen display 301 and the digitizer panel 312. According to an embodiment, the force touch panel 314 may replace a home key of the electronic device 300.

According to an embodiment, the biometric sensor 316 may perform user authentication based on biometric information of a user. For example, the biometric sensor 316 (e.g., the fingerprint sensor) may receive fingerprint information of the user through the touch screen display 301 and perform the user authentication based on the received fingerprint information. According to various embodiments, the biometric sensor 316 may include at least a portion of the sensor module 176 in FIG. 1.

Housing

According to an embodiment, the housing 320 may include a side member accommodating the components in the electronic device 300 described above. According to an embodiment, at least a part of an externally exposed surface of the side member may be formed of a conductive material (e.g., metal). According to an embodiment, the side member of the housing 320 may be used as an antenna of the electronic device 300. The side member may be configured to include an antenna having a Δ/4 length (e.g., an inverted-f antenna (IFA)). According to an embodiment, the housing 320 may surround a space between the front plate 310 and the back plate 330 by means of the side member when stacking the front plate 310 and the back plate 330.

According to an embodiment, the battery 322 may supply power necessary to drive the electronic device 300. According to various embodiments, the battery 322 may include the battery 189 in FIG. 1.

According to an embodiment, the printed circuit board (PCB) 324 may include the processor (e.g., the processor 120 in FIG. 1), the memory (e.g., the memory 130 in FIG. 1), the communication module (e.g., the communication module 190 in FIG. 1), and the power management module (e.g., the power management module 188 in FIG. 1) necessary to operate the electronic device 300. The PCB 324 may include a printed board assembly (PBA) and a flexible printed board assembly (FPCB) having various connectors such as battery contacts formed therein. The communication module may include a wireless communication circuit of the electronic device 300. The wireless communication circuit may be electrically connected to the processor. At least a portion of the side member of the housing 320 may be connected to at least a portion of the wireless communication circuit.

According to an embodiment, the FPCB 326 may include the loop coil 328 for wireless charging for charging the battery 322 wirelessly and a coil antenna for near field communication such as near field communication (NFC) or magnetic secure transmission (MST). According to various embodiments, the FPCB 326 may include the wireless charging module 250 in FIG. 2.

Back Plate

The back plate 330 may be, for example, a cover forming the back surface of the electronic device 300. The back plate 330 may be disposed opposite to the front plate 310. The back plate 330 may be positioned on the opposite side of the front plate 310 to face the front plate 310.

According to various embodiments, the electronic device of the present disclosure may be modified or changed differently from the electronic device 300 as disclosed in FIG. 3 in terms of a layout or a configuration of the components.

According to various embodiments, the electronic device may detect the battery swelling using a loop antenna (or, a loop coil antenna or the coil antenna) mounted on the FPCB 326. For example, when using the electronic device, in a case where the battery is swollen due to various causes, a gap between the battery and the loop antenna may be reduced or a portion of the battery may push up a portion of the loop antenna. According to an embodiment, the electronic device may detect changes in inductance and capacitance values of the loop antenna based on a change in the gap or a deformation degree of the loop antenna, and analyze the detected result to determine whether the battery is swollen. The method of the electronic device for determining whether the battery is swollen according to an embodiment will be described in detail as below.

First Layer

Figure 4:
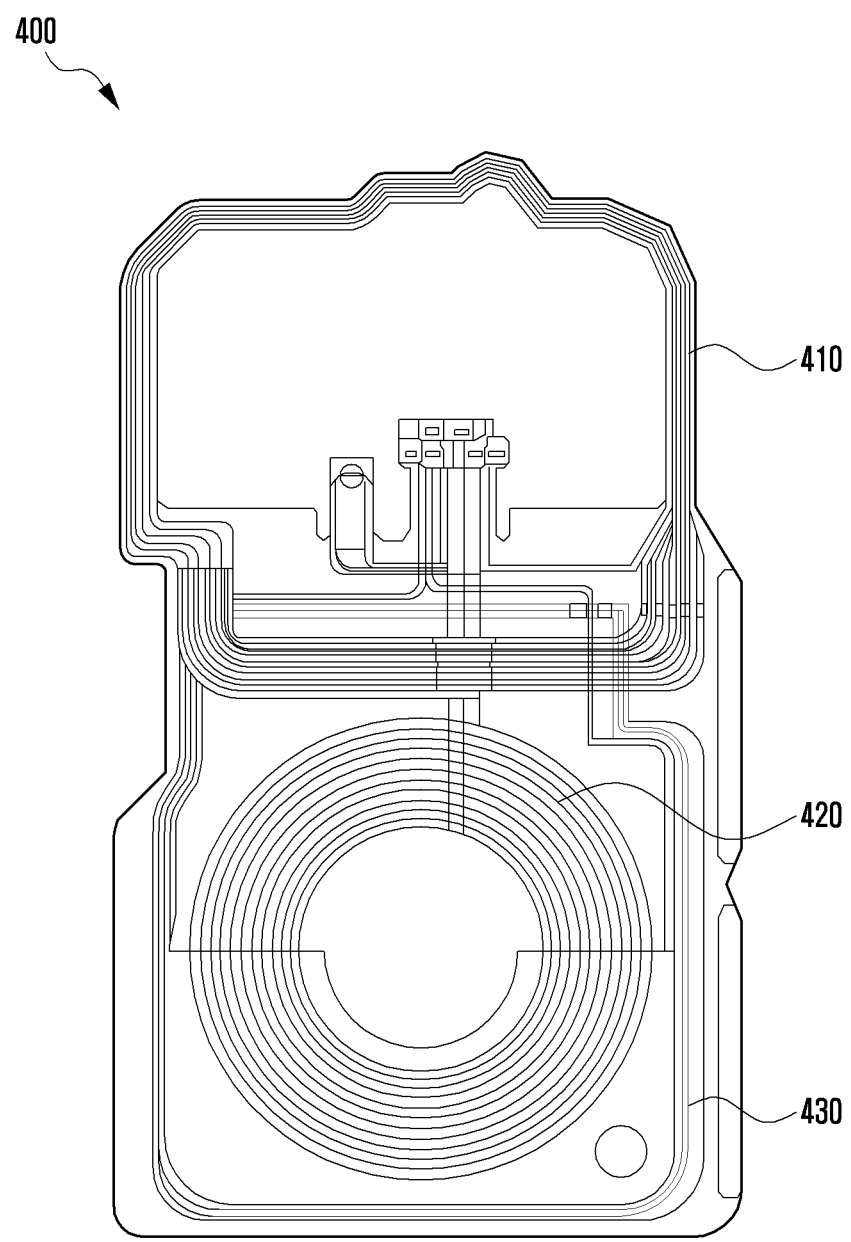
FIG. 4 is a top view illustrating an antenna module having a loop antenna according to various embodiments of the present disclosure.

FIG. 4 is a top view illustrating an antenna module having a loop antenna according to various embodiments of the present disclosure. According to an embodiment, FIG. 4 may be a schematic view illustrating a layout of the first layer on which the conductive pattern is disposed, in this case, a FPCB on which a loop antenna is mounted. According to an embodiment, the antenna module 400 shown in FIG. 4 may include the same or similar components as the antenna module 197 in FIG. 1.

Referring to FIG. 4, the antenna module 400 according to an embodiment may include a first loop antenna 410, a second loop antenna 420, or a third loop antenna 430, mounted on the FPCB.

According to an embodiment, the first loop antenna 410 may be an MST antenna for MST communication. For example, when the processor activates the MST communication (e.g., MST payment), the first loop antenna 410 may generate the magnetic field corresponding to an NFC scheme, and may detect the magnetic field corresponding to the MST scheme around the electronic device.

According to an embodiment, the second loop antenna 420 may be the wireless charging coil for wireless charging. For example, the second loop antenna 420 may have a form of a wireless power consortium (WPC) coil in order to charge the battery of the electronic device wirelessly.

According to an embodiment, the third loop antenna 430 may be the NFC antenna for NFC communication. For example, when the processor activates the NFC communication (e.g., NFC payment), the third loop antenna 430 may generate the magnetic field corresponding to the NFC scheme, and may detect the magnetic field corresponding to the NFC scheme around the electronic device.

According to various embodiments, the electronic device of the present disclosure may utilize at least one of the first to third loop antennas 410, 420 and 430 to detect the battery swelling. Although the following description describes the electronic device detecting the battery swelling using the third loop antenna 430, i.e., the NFC antenna, the battery swelling may be detected by using the MST antenna or the wireless charging antenna besides the NFC antenna, as shown in various embodiments of the present disclosure.

According to various embodiments, the electronic device of the present disclosure may be modified or changed in terms of an arrangement or a structure of the first to third loop antennas 410, 420 and 430 in a manner different from those shown in FIG. 4.

Circuitry

Figure 5A:
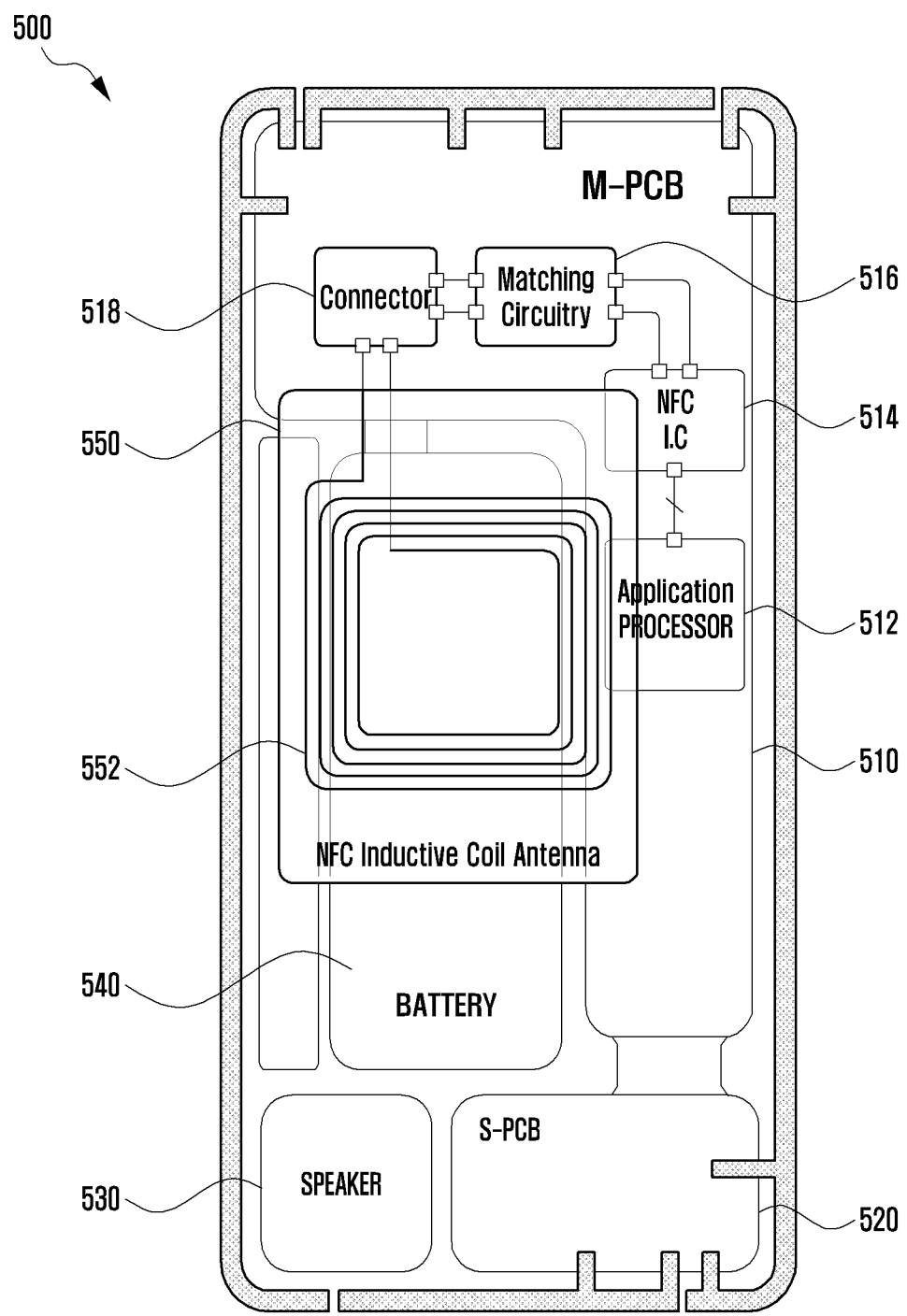
FIG. 5A and FIG. 5B are schematic diagrams illustrating layouts of components in the electronic device according to various embodiments of the present disclosure.
Figure 5B:
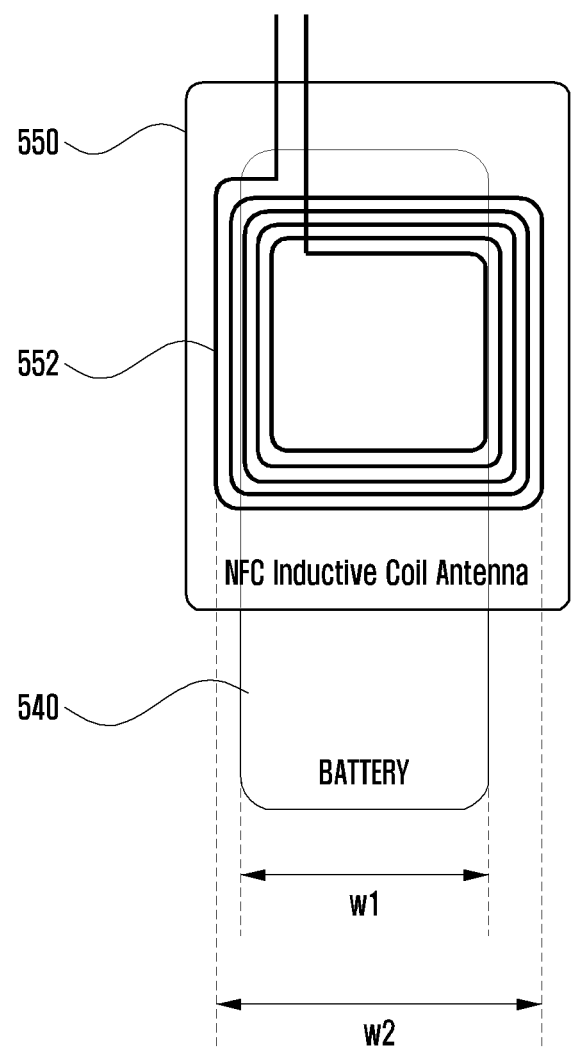

FIGS. 5A and 5B are schematic views each illustrating a layout of components in the electronic device. According to an embodiment, FIG. 5B may be a more detailed view of the layouts of the antenna module and the battery shown in FIG. 5A. According to an embodiment, the electronic device 500 shown in FIG. 5A may include at least some of the electronic device 101, 102 or 104 in FIG. 1 or the electronic device 300 in FIG. 3.

Referring to FIG. 5A, a first PCB (M-PCB), a second PCB (S-PCB), the battery 540, a speaker 530, or an antenna module 550 may be arranged in the electronic device 500.

According to an embodiment, the first PCB (M-PCB) may be a main PCB on which an application processor 512, NFC IC 514, an NFC matching circuitry 516, or an NFC connector 518 are mounted. According to an embodiment, at least a portion of the first PCB (M-PCB) may be connected to the second PCB (S-PCB). According to an embodiment, the second PCB (S-PCB) may be positioned at a lower end of the electronic device 500 when viewed from above. According to various embodiments, although not illustrated in the drawings, the first and second PCBs (M-PCB and S-PCB) may further include a primary receiver circuit, a diversity receiver circuit, a transceiver, or a communication processor as the wireless communication circuit. According to an embodiment, the primary receiver circuit may include a first low band transmitter/receiver circuit and a first high band transmitter/receiver circuit. According to an embodiment, the diversity receiver circuit may include a second low band transmitter/receiver circuit and a second high band transmitter/receiver circuit. In the above, the high band may mean a frequency of about 1.5 GHz to 2.7 GHz and the low band may mean a frequency of about 700 MHz to 1 GHz.

According to an embodiment, the battery 540 may be positioned at a central portion of the electronic device 500 when viewed from above. According to an embodiment, the first and second PCBs (M-PCB and S-PCB) may have a form wrapping around at least a portion of the battery 540 when viewed from above. For example, when viewed from above, a first side of the battery 540 and a second side connected to the first side may be adjacent to the first PCB (M-PCB), and a third side connected to the second side of the battery 540 and positioned opposite to the first side may be adjacent to the second PCB (S-PCB).

According to an embodiment, the speaker 530 may be positioned at a lower portion of the electronic device 500 when viewed from above.

According to an embodiment, the antenna module 550 may include at least one loop antenna connected to the first PCB (M-PCB) and may be positioned to overlap at least a portion of the battery 540. According to an embodiment, the at least one loop antenna may include an NFC antenna 552. For example, as shown in FIG. 5B, the NFC antenna 552 of the antenna module 550 may be positioned to overlap at least a portion of the battery 540. For example, when viewed from above, the battery 540 may have a first width, and the loop antenna of the antenna module 550 may be positioned to overlap the battery 540 while having a second width w2 greater than the first width w1 According to an embodiment, the electronic device 500 may detect the battery swelling more accurately by allowing the loop antenna (e.g., the NFC antenna 552) constituted by an inductive coil to overlap at least a portion of the battery 540.

According to various embodiments, the electronic device 500 of the present disclosure may be modified or changed in terms of an arrangement of the antenna module 550 with reference to the battery 540 in a manner different from those shown in FIGS. 5A and 5B.

Coil Overlapping the Battery

Figure 6A:
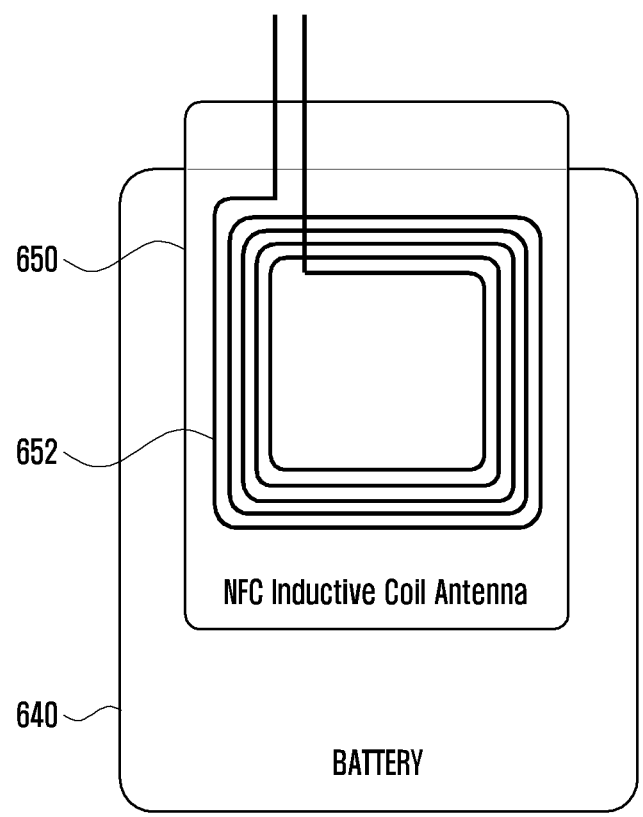
FIG. 6A, FIG. 6B, and FIG. 6C are exemplary diagrams each illustrating a layout of an antenna module with reference to a battery according to various embodiments of the present disclosure.
Figure 6B:
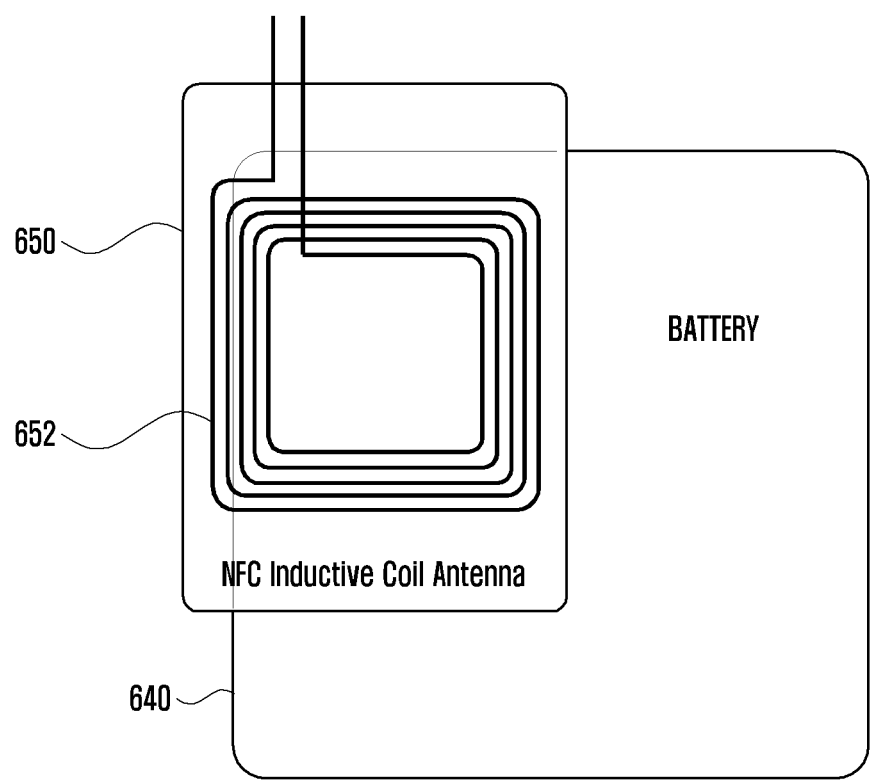
Figure 6C:
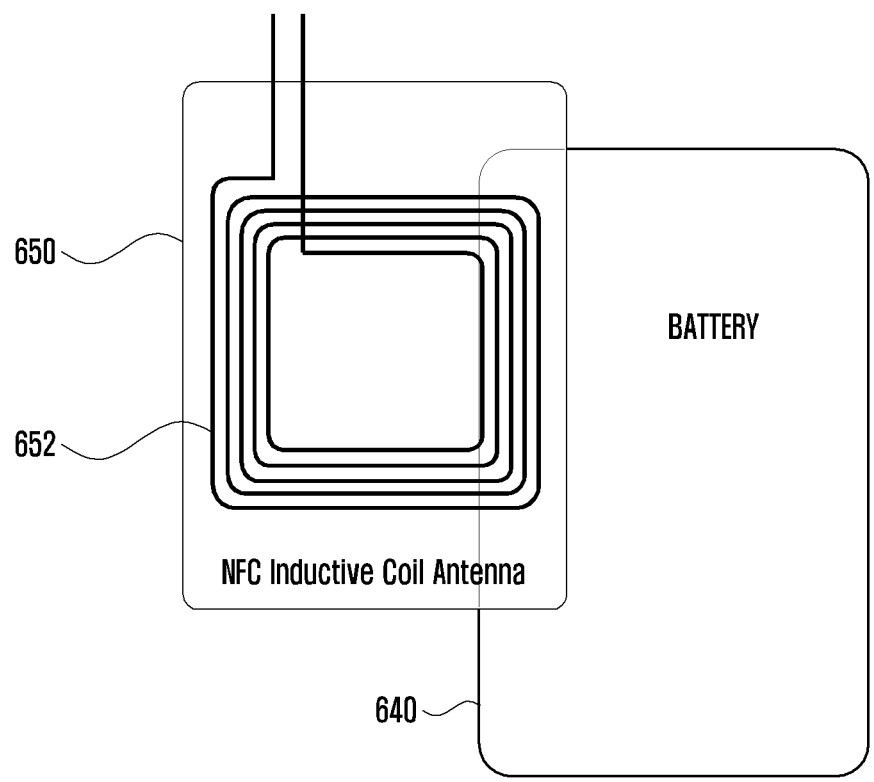

FIGS. 6A to 6C are exemplary views illustrating layouts of antenna modules with reference to a battery according to various embodiments.

Hereinafter, a region in which the battery is mounted is defined as 'a battery region 640 (e.g., 540 in FIG. 5B)', and a region in which the antenna module including an NFC antenna 652 (e.g., 552 in FIG. 5B) is mounted is defined as 'an antenna region 650 (e.g., 550 in FIG. 5B)'.

According to various embodiments, the battery region 640 and the antenna region 650 overlap each other, and an area of the antenna region 650 overlapping the battery region 640 may be variously changed as follows. According to an embodiment, as shown in FIG. 6A, the area of the antenna region 650 may be smaller than that of the battery region 640, and the antenna region 650 may overlap at least a portion of the battery region 640. According to an embodiment, the NFC antenna 652 included in the antenna module may be positioned to overlap the interior of the battery region 640, such that the entire periphery of the NFC antenna 652 is within the periphery of the battery region 640.

According to another embodiment, as shown in FIG. 6B, an area of an antenna region 650 may be smaller than that of a battery region 640, and an NFC antenna 652 included in an antenna module may be positioned allowing only a first portion thereof to overlap the interior of the battery region 640.

According to another embodiment, as shown in FIG. 6C, an area of an antenna region 650 may be smaller than that of a battery region 640, and an NFC antenna 652 included in an antenna module may be positioned allowing only a second portion thereof, which is smaller than the first portion, to overlap the interior of the battery region 640.

According to various embodiments, the greater the area of the antenna region 650 overlapping the battery region 640, the greater the accuracy with which the electronic device may detect the battery swelling. For example, the area of the antenna region 650 overlapping the battery region 640 may be the greatest in an example in FIG. 6A and the smallest in an example in FIG. 6C, so that the accuracy with which the electronic device detects the battery swelling may be the greatest in the example in FIG. 6A and the smallest in the example in FIG. 6C, among the examples of FIG. 6A-6C. However, various embodiments may use the examples in FIG. 6B or 6C as the accuracy of detecting battery swelling may be acceptable, and the NFC antenna 652 is not confined to be only within the battery region.

Figure 7:
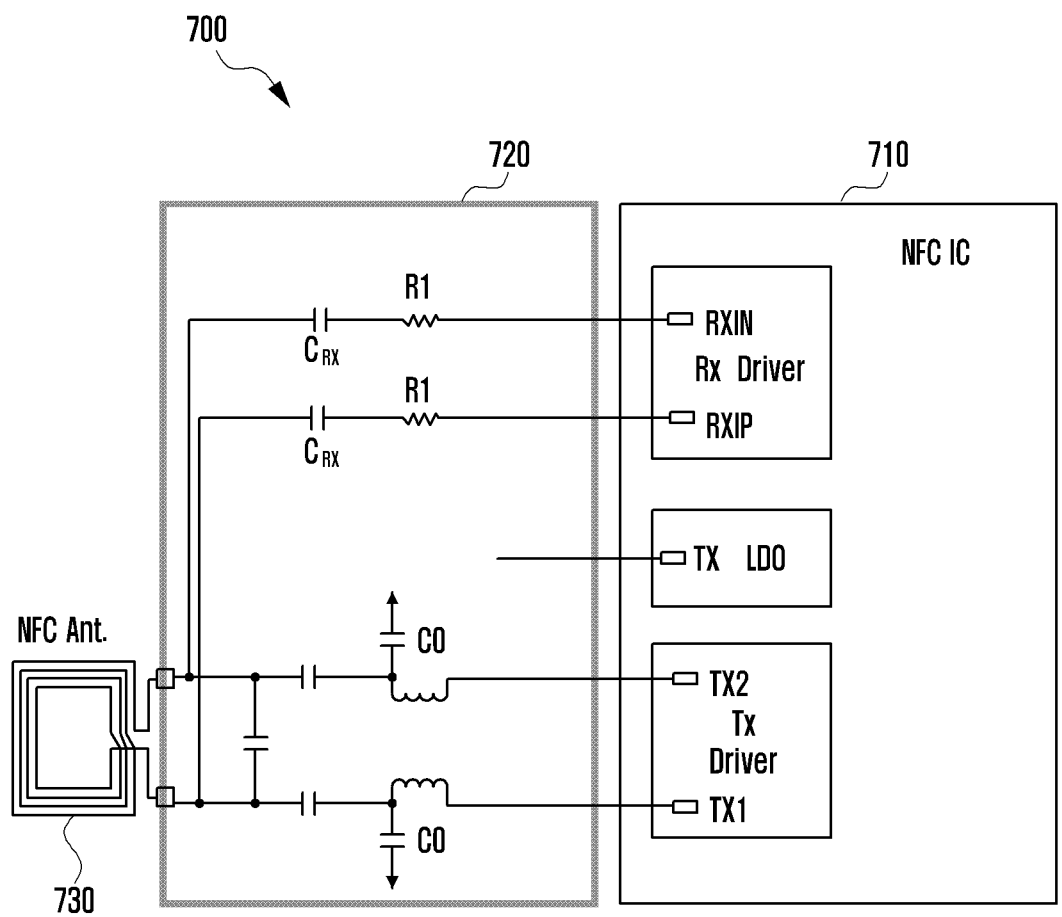
FIG. 7 is a schematic block diagram illustrating structures of a near field communication (NFC) integrated circuit (IC) and an NFC antenna according to an embodiment of the present disclosure.

FIG. 7 is a schematic block diagram illustrating structures of a near field communication integrated circuit (NFC IC) and an NFC antenna according to an embodiment. According to an embodiment, an antenna module 700 shown in FIG. 7 may include at least some of the antenna module 400 in FIG. 4 or the antenna module 550 in FIG. 5.

Referring to FIG. 7, the antenna module 700 of the electronic device may include the NFC IC 710, a matching circuitry 720, or an NFC antenna 730.

According to an embodiment, the NFC IC 710 may include a Tx driver, a regulator Tx LDO, or an Rx driver. According to an embodiment, the Tx driver may include a first transmission terminal Tx1 and a second transmission terminal Tx2. For example, the Tx driver may perform a transmission operation through the first transmission terminal Tx1 and the second transmission terminal Tx2 in an NFC transmission operation. According to an embodiment, the regulator may be connected to a power supply voltage (VDD) and transmit a power supply voltage for transmission to the Tx driver. According to an embodiment, the regulator may be constituted by a low drop-out regulator and correct a level of the power supply voltage for transmission in response to the control signal from the application processor (e.g., 512). According to an embodiment, the Rx driver may include at least one receiver terminal (RXIN and RXIP). For example, the Rx driver may demodulate a signal transmitted through the NFC antenna 730 to generate received data and transmit the generated received data to the application processor 512 in an NFC reception operation.

According to an embodiment, the matching circuitry 720 may be disposed between the NFC IC 710 and the NFC antenna 730. For example, the matching circuitry 720 may include at least one capacitor and at least one inductor for a frequency matching between the NFC IC 710 and the NFC antenna 730.

Figure 8:
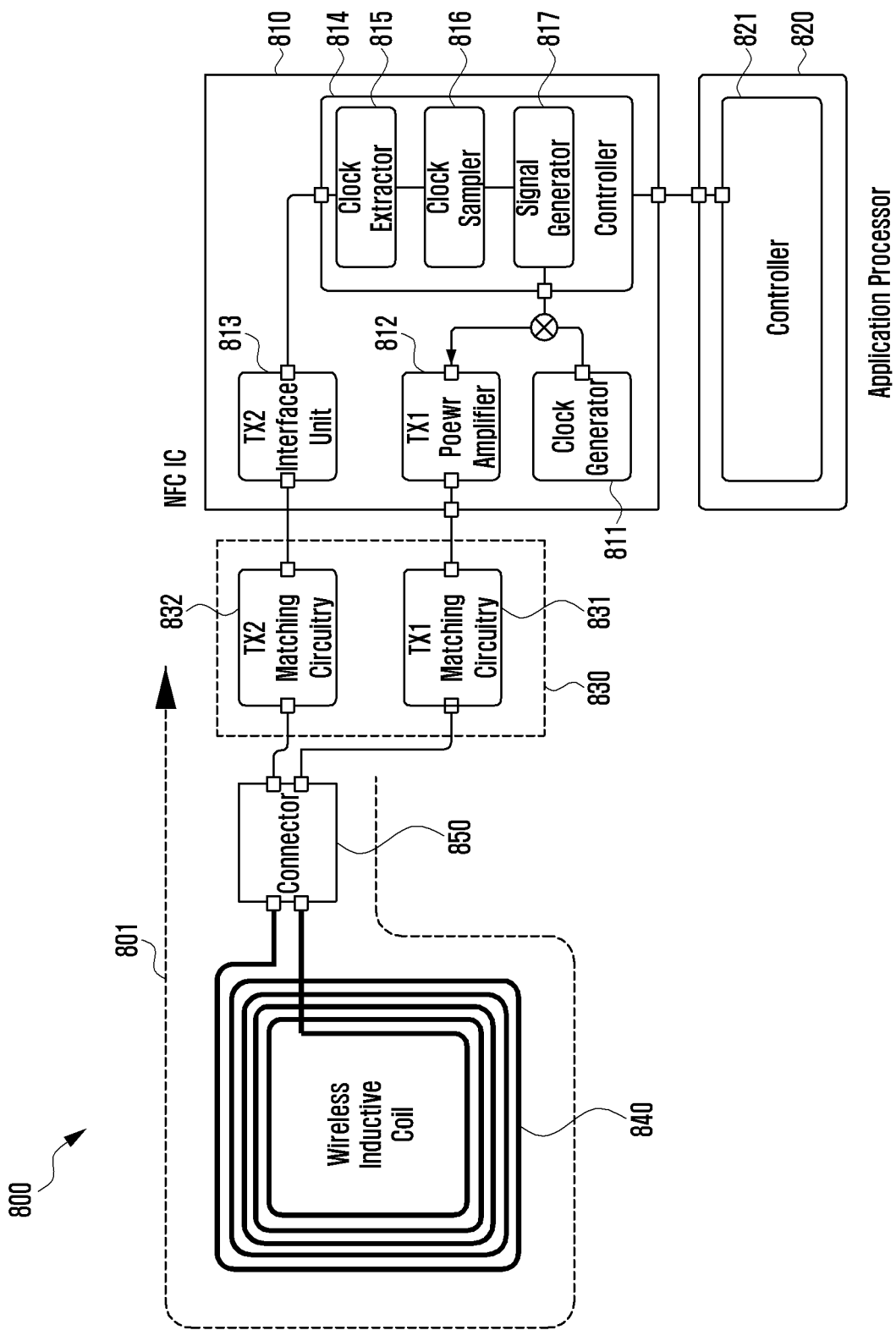
FIG. 8 is a detailed block diagram illustrating the structure of the NFC IC according to various embodiments of the present disclosure.
Figure 9:
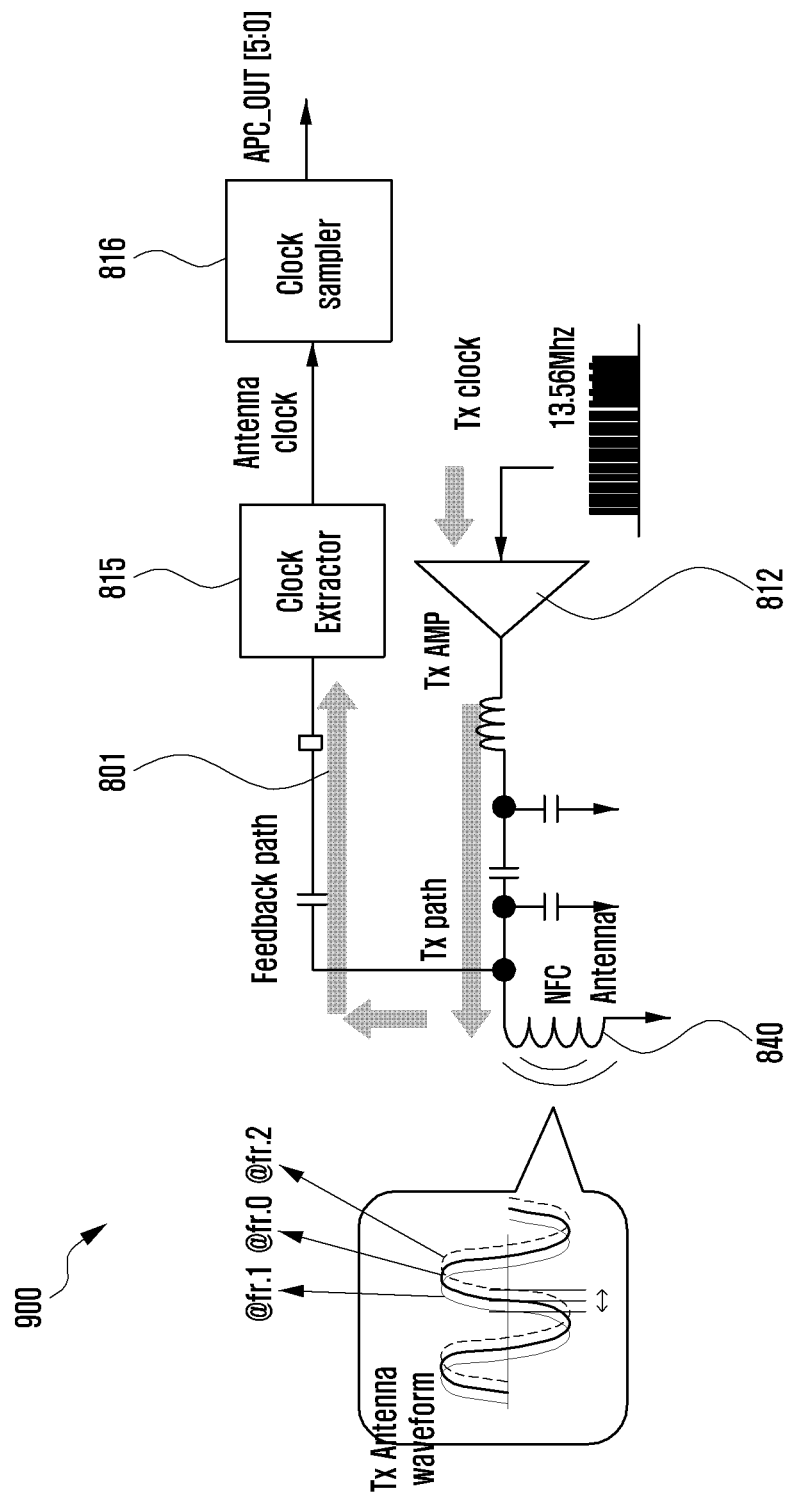
FIG. 9 is a schematic block diagram illustrating an operation of the NFC IC for detecting a battery swelling according to various embodiments of the present disclosure.

FIG. 8 is a detailed block diagram illustrating the structure of the NFC IC. FIG. 9 is a schematic block diagram illustrating an operation of the NFC IC for detecting the battery swelling. According to an embodiment, FIG. 8 may be a detailed example illustrating the structures of the Tx driver and the NFC antenna of the NFC IC shown in FIG. 7.

Determining the Phase Difference

Referring to FIGS. 8 and 9, the Tx driver of the NFC IC 810 configured in an electronic device 800 (e.g., 500 in FIG. 5) may include a clock generator 811, a power amplifier 812, a transmission interface unit 813 or a transmission controller 814.

According to an embodiment, the clock generator 811 generates a clock signal. For example, the clock signal generated from the clock generator 811 may be output to the first transmission terminal (e.g., Tx1) through the power amplifier 812 and also transmitted for a clock sampler 816 of the transmission controller 814.

According to an embodiment, the power amplifier 812 may output the clock signal from the clock generator 811 to the first transmission terminal Tx1.

According to an embodiment, the transmission interface unit 813 may receive the clock signal, which is output to the first transmission terminal Tx1 and passing through an NFC antenna 840, through a second transmission terminal (e.g., Tx2). The transmission interface unit 813 may transmit the clock signal received through the second transmission terminal Tx2 for the clock extractor 815 of the transmission controller 814.

According to an embodiment, the transmission controller 814 may include the clock extractor 815, the clock sampler 816, or a signal generator 817. According to an embodiment, the transmission controller 814 may be connected to the application processor 820. For example, the transmission controller 814 may be connected to a communication controller 821 of the application processor 820.

According to an embodiment, the clock extractor 815 may convert the clock signal received through the NFC antenna 840 into a digital signal. For example, the clock extractor 815 may recover a clock signal having a frequency of about 13.56 MHz, which is a frequency corresponding to the NFC communication, into a digital clock signal. According to an embodiment, the clock extractor 815 may include an analog to digital converter (ADC). According to an embodiment, the clock extractor 815 may transmit a converted digital signal for the clock sampler 816.

According to an embodiment, the clock sampler 816 may compare the clock signal received from the clock generator 811 with the clock signal received by the NFC antenna 840 (i.e., the digital signal received from the clock extractor 815) passing through a path 801 and generate a digital value having a specific bit (e.g., 6 bits) based on the comparison result. When the phase of the clock signal received from the clock generator 811 and the phase of the clock signal received through the NFC antenna 840 are different from each other, the greater a difference of the phases, the greater the digital value generated from the clock sampler 816. According to an embodiment, the clock sampler 816 may provide the generated digital value to the application processor 820, and then the application processor 820 may output the control signal to correct a performance of the NFC communication with reference to a table where the digital value is previously stored. For example, the application processor 820 may calculate an impedance and the phasor value using the digital value based on a phase change in the clock signal, and determine a compensation value responding to the calculated phasor value with reference to a correction table in which the phasor value and the corrected value are mapped to each other. The application processor 820 may generate the control signal to compensate for the phase of the clock signal based on the determined compensation value and transmit the control signal to the signal generator 817 of the NFC IC 810.

According to an embodiment, the signal generator 817 may control the phase of the clock signal output from the clock generator 811 to be corrected in response to the control signal transmitted from the application processor 820, such that the electronic device 800 of the present disclosure may improve a recognition rate of the NFC communication.

Six Bit Code

According to an embodiment, the phase change of the clock signal may be made in a range between about 12.5 MHz and 14.5 MHz in the NFC communication. For changes in this range, the clock sampler 816 of the NFC IC 810 may digitize the digital signal transmitted from the clock extractor 815 into a 6-bit code. The application processor 820 may calculate the 6-bit code provided from the clock sampler 816 to a number ranging from 0 to 120, and determine whether the NFC antenna 840 performs a normal operation based on a result of comparing the calculated value with the pre-stored reference value. According to an embodiment, a sampling unit of the clock sampler 816 may be about 1.5 nsec (a period for 12.5 MHz is 80 nsec, a period for 14.5 MHz is 68 nsec, thereby permitting between 45 and 53.33 samples per period), and sampling time may be correctable.

TABLE 1

| <5> | <4> | <3> | <2> | <1> | <0> |
|---|---|---|---|---|---|
| 0 | 0 | 0 | 0 | 0 | 0 |
| 0 | 0 | 0 | 0 | 0 | 1 |
| 0 | 0 | 0 | 0 | 1 | 1 |
| 0 | 0 | 0 | 1 | 1 | 1 |
| 0 | 0 | 1 | 1 | 1 | 1 |
| 0 | 1 | 1 | 1 | 1 | 1 |
| 1 | 1 | 1 | 1 | 1 | 1 |

Table 1 is an example showing a 6-bit code value sampled from the clock sampler 816. Referring to Table 1, when the clock sampler 816 starts sampling, a Bit pattern may be output as shown in Table 1. According to an embodiment, the electronic device 800 may determine that a circuit operation of the NFC IC 810 is abnormal when the Bit pattern is not continuous, and control the operation of the NFC IC 810 to be reset,

TABLE 2

| 6-bit value | Formula substitution to extract phasor value | Phasor value |
|---|---|---|
| 000000 | Phasor value = 60 − (0*10) | 60 |
| 110000 | Phasor value = 60 − (2*10) | 40 |

Referring to Table 2, a method by which the electronic device 800 of the present disclosure calculates the phasor value from the 6-bit code value may be as follows: For example, a reference value when a resonance frequency is 13.56 MHz may be set to 60. According to an embodiment, the electronic device 800 may calculate the phasor value by adding (bit number*10) to the reference value 60 when the phase leads (i.e., the resonance frequency is high), as shown in Equation 1. According to an embodiment, the electronic device 800 may calculate the phasor value by subtracting (bit number*10) from the reference value 60 when the phase lags (i.e., the resonance frequency is low), as shown in Equation 2.

$$\text{Phase value} = 60(\text{Reference Value}) + (\text{Number Extracted from 6Bits}*10) \quad \text{[Equation 1]}$$

According to an embodiment, the electronic device 800 may calculate the phasor value by subtracting (bit number*10) from the reference value 60 when the phase lags (i.e., the resonance frequency is low), as shown in Equation 2.

$$\text{Phase value} = 60(\text{Reference Value}) - (\text{Number Extracted from 6Bits}*10) \quad \text{[Equation 2]}$$

When the battery is swollen in driving (using) the electronic device 800, the resonance frequency of the NFC antenna 840 may be lowered due to the influence of the swelling. According to an embodiment, the electronic device 800 may subtract a value (bit number*10) from the equation for deriving the phasor value when the resonance frequency is lowered for reasons such as the battery swelling and the like. In a case where the phase value of the clock signal is not delayed, the 6-bit code value is '000000' as shown in Table 2, and the phasor value by the equation is 60−(0*10) =60. In a case where the 6-bit code value is '110000', the phasor value by the equation is 60−(2*10)=40.

According to an embodiment, the electronic device 800 may output the clock signal for about 2 ms per operation when operating the NFC IC 810, and calculate an average of the phasor values calculated at each sampling by performing the sampling process at least 50 times. According to an embodiment, the electronic device 800 may compensate for the phase of the clock signal based on the calculated average value and may also determine whether the battery is swollen.

Embodiment when Battery is not Swollen

Figure 10A:
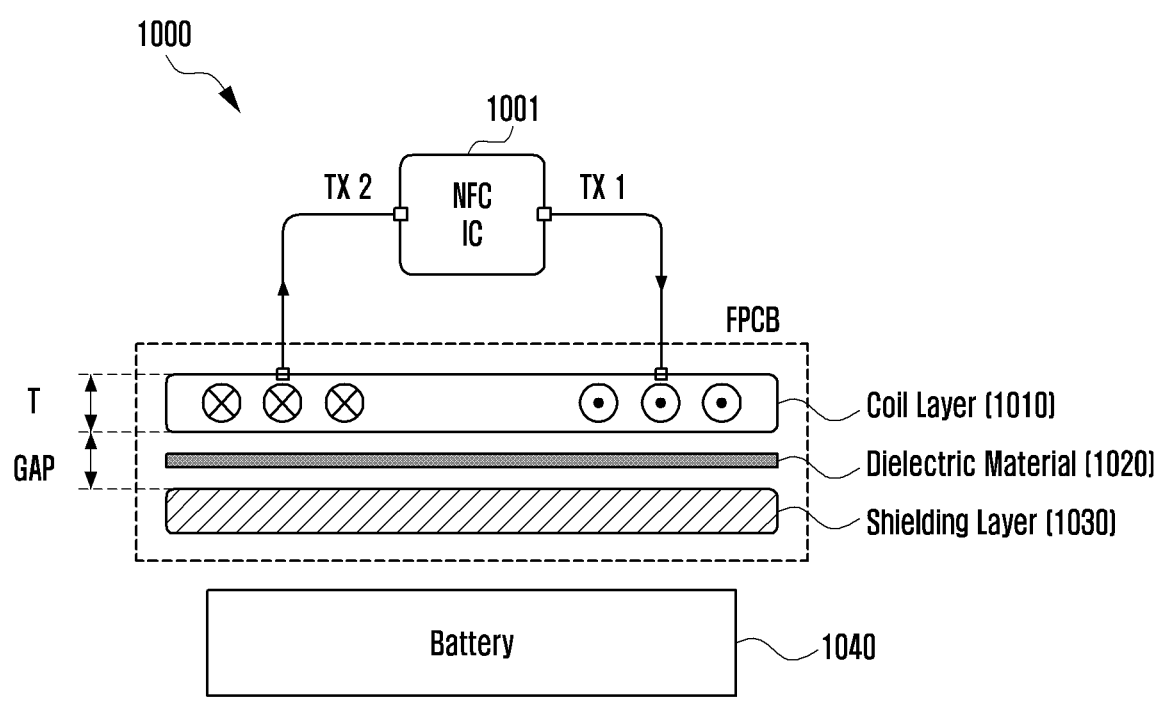
FIG. 10A and FIG. 10B are diagrams illustrating a structure and an operation of the electronic device when the battery is in a normal state according to various embodiments of the present disclosure.
Figure 10B:
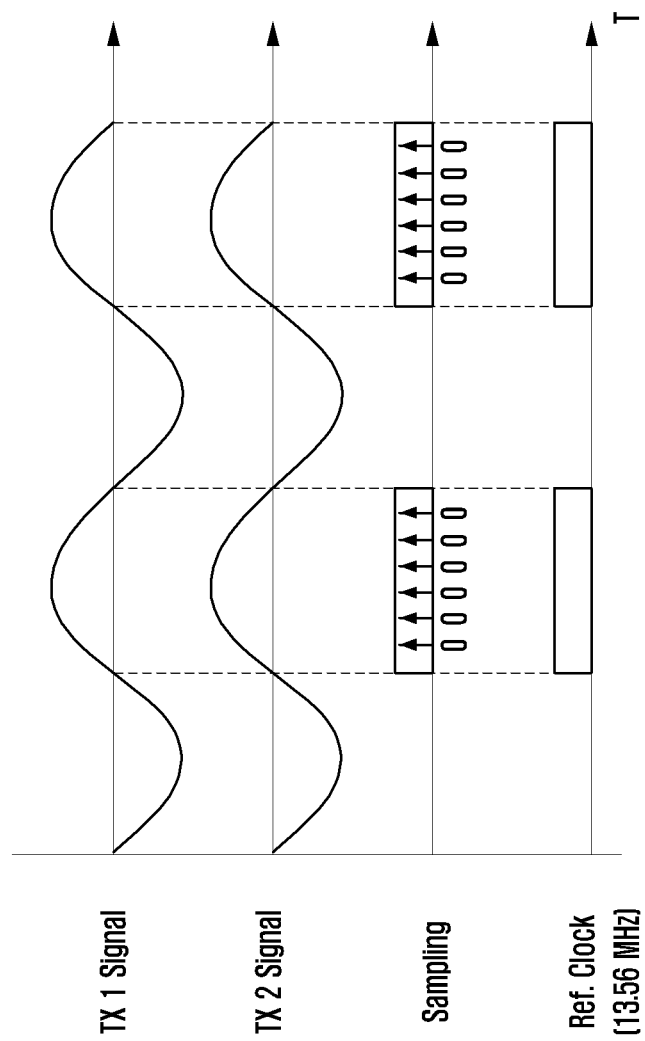

FIGS. 10A and 10B are views illustrating a structure and an operation of the electronic device 800 when the battery is in a normal state. According to an embodiment, FIG. 10A is a schematic cross-sectional view illustrating the structure of the electronic device 800 when the battery is in a normal state, and FIG. 10B is a drive waveform diagram illustrating the operation of the electronic device 800 when the battery is in a normal state. As can be seen, coil layer 1010, dielectric material 1020, and shielding layer 1030 are relatively planar and uncurved.

Referring to FIGS. 10A and 10B, the FPCB including the NFC antenna 840 according to an embodiment may be positioned on the top of the battery. The FPCB, for example, may include a coil layer 1010 on which the NFC antenna 840 is formed and a shielding layer 1030 positioned in a lower portion of the coil layer 1010, wherein the coil layer 1010 and the shielding layer 1030 may be attached to each other by an adhesive 1020 and a gap generated by the adhesive 1020 may serve as a dielectric layer. Even though a battery 1040 is in a normal state, a volume of an electronic device 1000 (for example, 800 in FIG. 8) of the present disclosure may be changed at the time of charging and discharging the battery 1040, such that an air gap between the shielding layer 1030 and the battery 1040 may be formed.

The NFC IC 810 according to an embodiment may output the clock signal to the NFC antenna 840 through the first transmission terminal Tx1, and receive the clock signal passing through the NFC antenna 840 via the second transmission terminal Tx2. In a case where the battery 1040 is in a normal state, the phase delay of the clock signal output from the NFC IC 810 through the first transmission terminal Tx1 does not occur. Therefore, as shown in Table 2, the 6-bit code value is '000000', and the electronic device 1000 may determine that the battery 1040 is in a normal state. According to an embodiment, the electronic device 1000 may compare the 6-bit code value, generated by comparing the phases of the two clock signals with each other, with the reference value stored in a memory (e.g., 130) to determine whether the battery 1040 is in a normal state.

Embodiment when Battery is Swollen

Figure 11A:
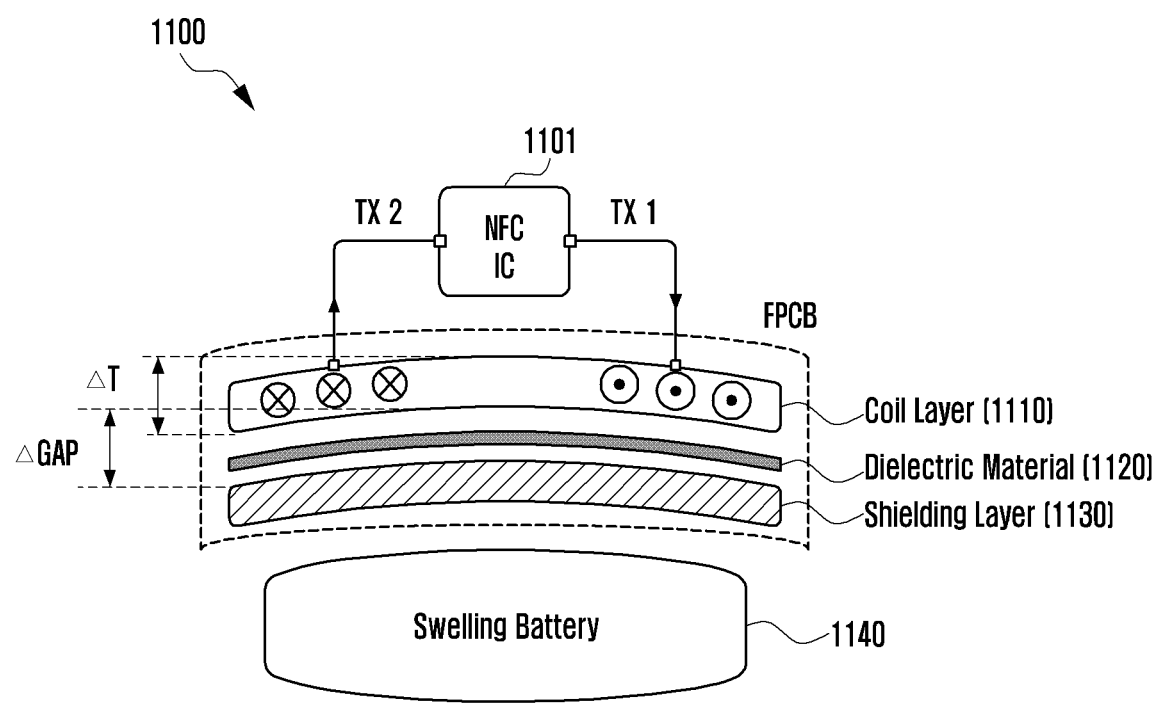
FIG. 11A and FIG. 11B are diagrams illustrating a structure and an operation of the electronic device when the battery is swollen.
Figure 11B:
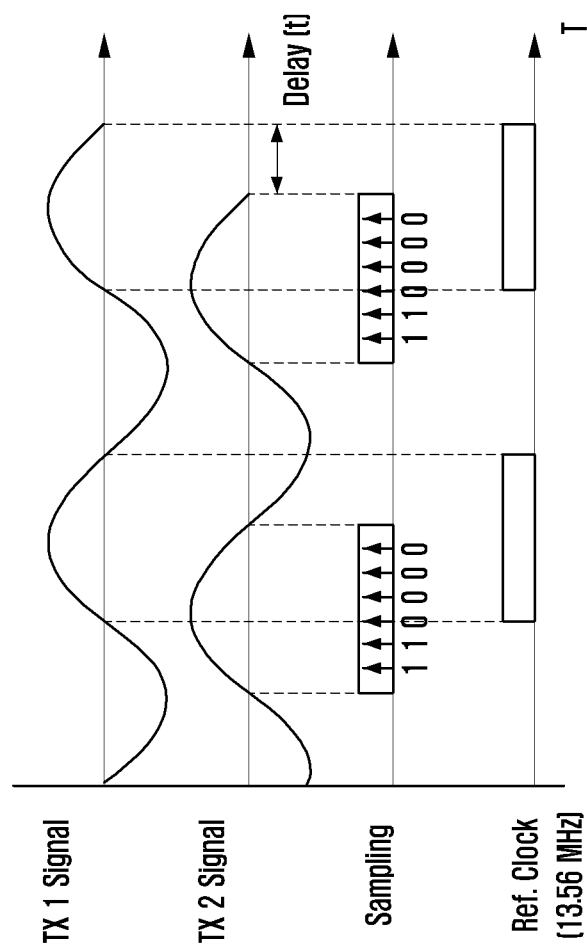

FIGS. 11A and 11B are views illustrating a structure and an operation of the electronic device 800 when the battery is swollen. According to an embodiment, FIG. 11A is a schematic cross-sectional view illustrating the structure of the electronic device 800 when the battery is swollen, and FIG. 11B is a drive waveform diagram illustrating the operation of the electronic device 800 when the battery is swollen. As can be seen, due to the swelling of the battery 1140, the coil layer 1110, dielectric material 1120, and shielding layer 1130 are curved.

Referring to FIGS. 11A and 11B, the FPCB including the NFC antenna 840 according to an embodiment may be positioned on the top of a battery 1140. The FPCB, for example, may include the coil layer 1110 on which the NFC antenna 840 is formed and the shielding layer 1130 positioned in the lower portion of the coil layer 1110, wherein the coil layer 1110 and the shielding layer 1130 may be attached to each other by the adhesive 1120 and the gap generated by the adhesive 1120 may serve as the dielectric layer.

An NFC IC 1101 according to an embodiment may output the clock signal to the NFC antenna 840 through the first transmission terminal Tx1, and receive the clock signal passing through the NFC antenna 840 via the second transmission terminal Tx2. When the battery 1140 is swollen, the resonance frequency of the NFC antenna 840 is lowered due to the influence of the swelling, and the phase delay of the clock signal output from the NFC IC 1101 through the first transmission terminal Tx1 may occur. Therefore, the 6-bit code value may be a value different from '000000', for example, '110000' as shown in the example of Table 2 due to the curvature of coil layer 1010, dielectric material 1120, and shielding layer 1130. An electronic device 1100 (e.g., 800 in FIG. 8) may determine whether the battery 1140 is in an abnormal state by identifying that the 6-bit code value is different from '000000', and determine a delay degree of the clock signal and the swelling degree of the battery 1140.

According to various embodiments, features associated with conductive shielding members (e.g., 1030 and 1130), as shown in FIGS. 10 and 11 above, may be as follows. For example, the conductive shielding members 1030 and 1130, attached to the inductive coil antenna such as the NFC antenna (e.g., 840) and having a shielding function, may have inherent inductance and capacitance values. The conductive shielding members 1030 and 1130 may be mainly made of a soft magnetic material, and for example, a main component may be a compound containing a Fe component. According to an embodiment, a magnetic body may include ferrite, amorphous, nanocrystal, or the like. For example, ferrite may be a ceramic material, and amorphous and nanocrystal may be a metal sheet.

The electronic device 800, utilizing the antenna using the magnetic field such as the near field communication (NFC), the magnetic secure transmission (MST), or the wireless charging coil (e.g., the wireless power charging (WPC)) and the like, may include the conductive shielding members 1030 and 1130 having a shielding function to improve a performance. Since the frequencies at which the respective conductive shielding members 1030 and 1130 may be shielded are different from each other, types of the conductive shielding members 1030 and 1130 may be different depending on the frequency used for the magnetic field communication.

When the battery is swollen, pressure by at least a portion of the battery 1140 may be delivered to the antenna module. The pressure may cause cracks in the conductive shielding members 1030 and 1130 attached to the antenna using the magnetic field (for example, the coil layer 1010), and the inductance and capacitance values of the conductive shielding members 1030 and 1130 may be changed due to the cracks.

TABLE 3

| Battery swelling (mm) | Inductance (L) (uH) of inductive coil | Capacitance (C) (pF) of inductive coil | Impedance (Z) of Inductive coil | Resonance frequency (Mhz) of NFC antenna |
|---|---|---|---|---|
| 0 | 1.916 | 2.24 | 1.36 | 13.56 |
| 1 | 1.921 | 2.71 | 1.37 | 13.45 |
| 2 | 1.926 | 2.92 | 1.37 | 13.30 |
| 3 | 1.933 | 3.26 | 1.38 | 13.15 |
| 4 | 1.951 | 3.52 | 1.39 | 13.00 |
| 5 | 1.971 | 4.01 | 1.4 | 13.00 |

Table 3 shows experimental result of changes in inductance and capacitance values of the conductive shielding members 1030 and 1130 depending on the degree of the battery swelling. As shown in Table 3, when the battery is swollen, the inductance and capacitance values of the conductive shielding members 1030 and 1130 may be changed, and accordingly, the inductance and capacitance values of the antenna (for example, the NFC antenna 840) using the magnetic field may also be changed. As shown in Table 4 or Table 5, which is an experimental result, as the resonance frequency of the antenna is varied, the phase delay of the clock signal output from the NFC IC 1101 through the first transmission terminal Tx1 may occur. And accordingly, the phasor value calculated through the NFC IC 1101 may be different from the pre-stored phasor value corresponding to the state in which the battery is in a normal state.

TABLE 4

| Degree (mm) of battery swelling | Resonance frequency (Mhz) of NFC antenna | Impedance value (Z) of NFC antenna | Digitized value at clock extractor unit |
| --- | --- | --- | --- |
| 0 | 13.90 | 1.360 | 71~73 |
| 1 | 13.80 | 1.370 | 67~69 |
| 2 | 13.70 | 1.375 | 63~65 |
| 3 | 13.60 | 1.380 | 59~61 |

TABLE 5

| Degree (mm) of battery swelling | Resonance frequency (Mhz) of NFC antenna | Impedance value (Z) of NFC antenna | Digitized value at clock extractor unit |
| --- | --- | --- | --- |
| 0 | 13.50 | 1.385 | 56~58 |
| 1 | 13.40 | 1.390 | 52~54 |
| 2 | 13.20 | 1.400 | 49~51 |
| 3 | 13.00 | 1.420 | 40~41 |

Figure 12:
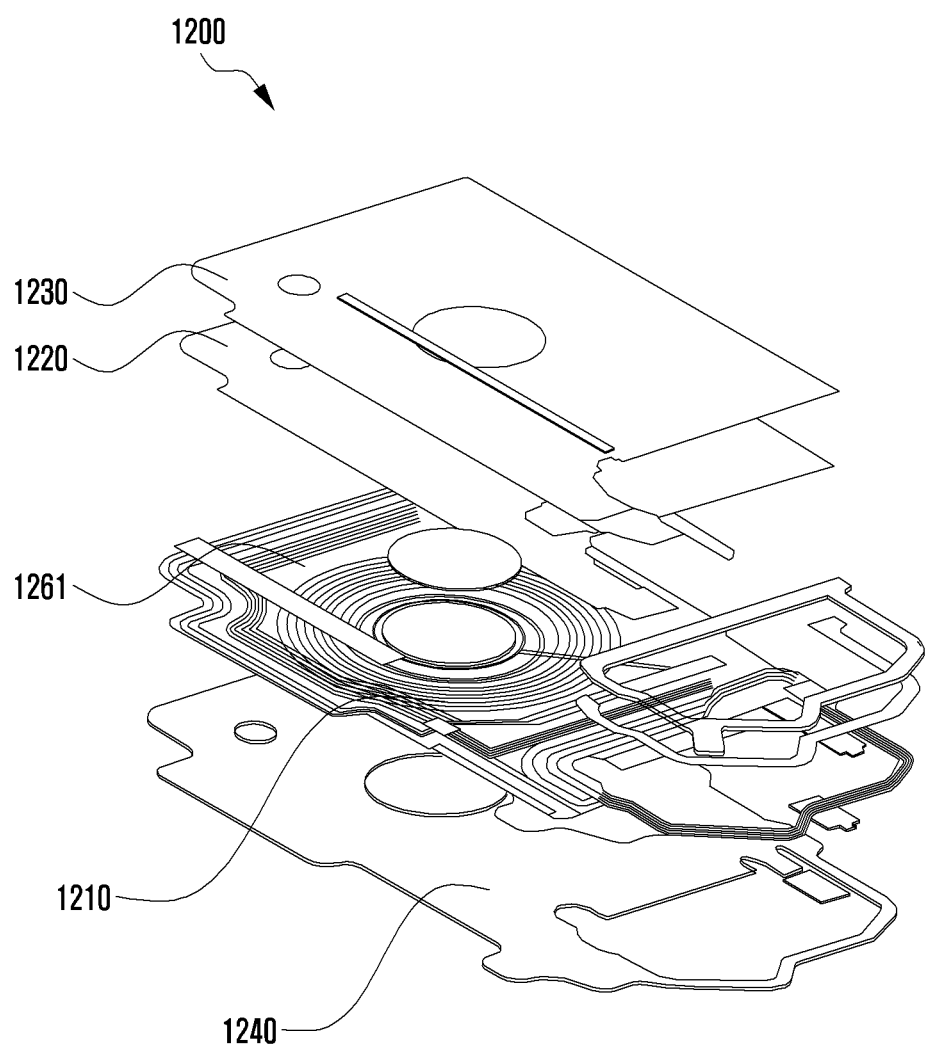
FIG. 12 is an exploded perspective diagram illustrating a stacked structure of a flexible printed circuit board (FPCB), on which the NFC antenna is mounted, and components around the FPCB according to various embodiments of the present disclosure.
Figure 13:
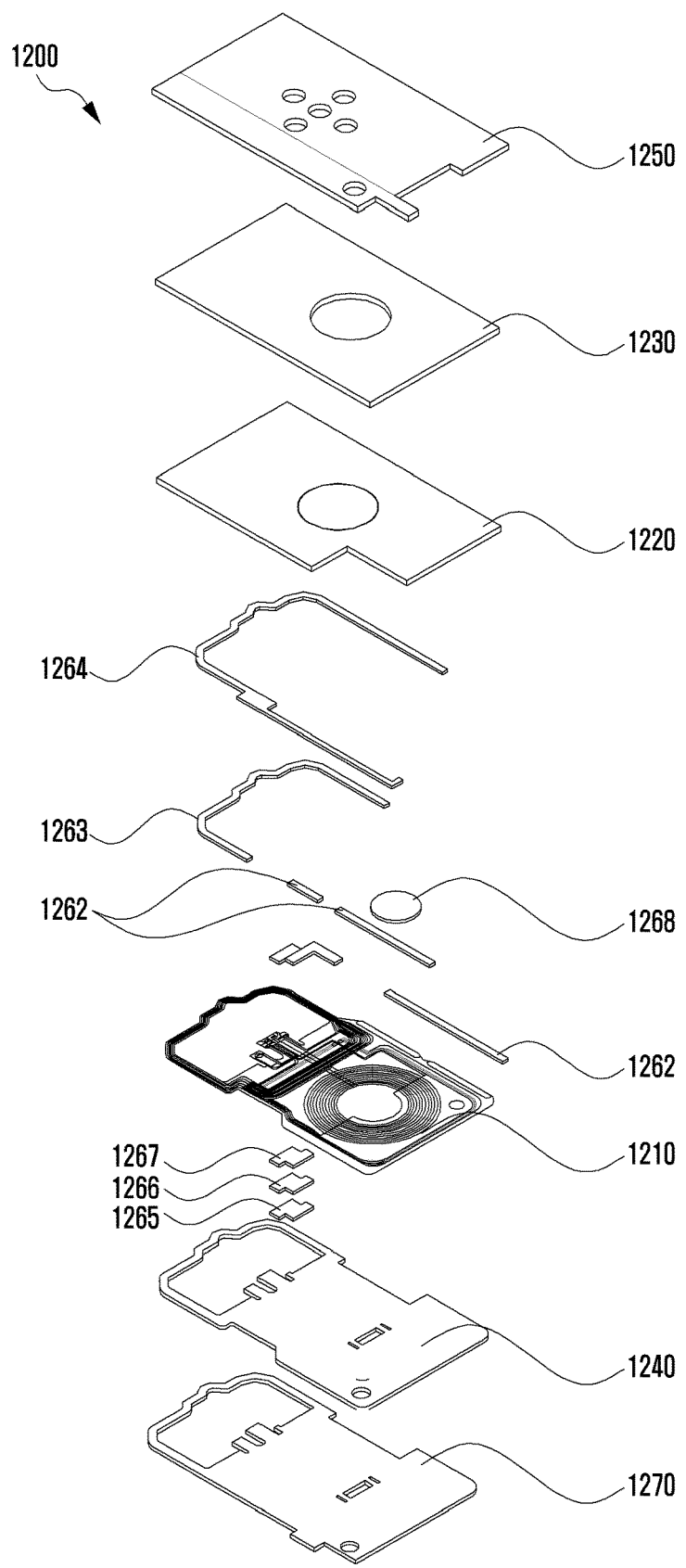
FIG. 13 is an exploded perspective diagram illustrating the stacked structure of the FPCB, on which the NFC antenna is mounted, and the components around the FPCB at an angle different from that in FIG. 12 according to various embodiments of the present disclosure.

FIG. 12 is an exploded perspective view illustrating a stacked structure of a flexible printed circuit board (FPCB), on which the NFC antenna 840 is mounted, and components around the FPCB. FIG. 13 is an exploded perspective view illustrating the stacked structure of the flexible printed circuit board (FPCB), on which the NFC antenna 840 is mounted, and the components around the FPCB at an angle different from that in FIG. 12.

Referring to FIGS. 12 and 13, in electronic devices 1200 and 1300 (e.g., 800 in FIG. 8) according to an embodiment, with reference to an FPCB 1210 on which the NFC antenna (e.g., 840) is mounted which can be a first layer, a protective film 1250, graphite 1230 which can be a second layer, a shielding sheet 1220 which can be a third layer disposed between the first layer and the second layer, a first adhesive liner 1264, a camera adhesive 1263, a side adhesive 1262 or an actuator 1268 may be positioned above the FPCB 1210; and a stiffening member 1267, an adhesive 1266, a second adhesive liner 1265, a sponge cushion 1240, or a carrier film 1270 may be positioned below the FPCB 1210.

Figure 14:
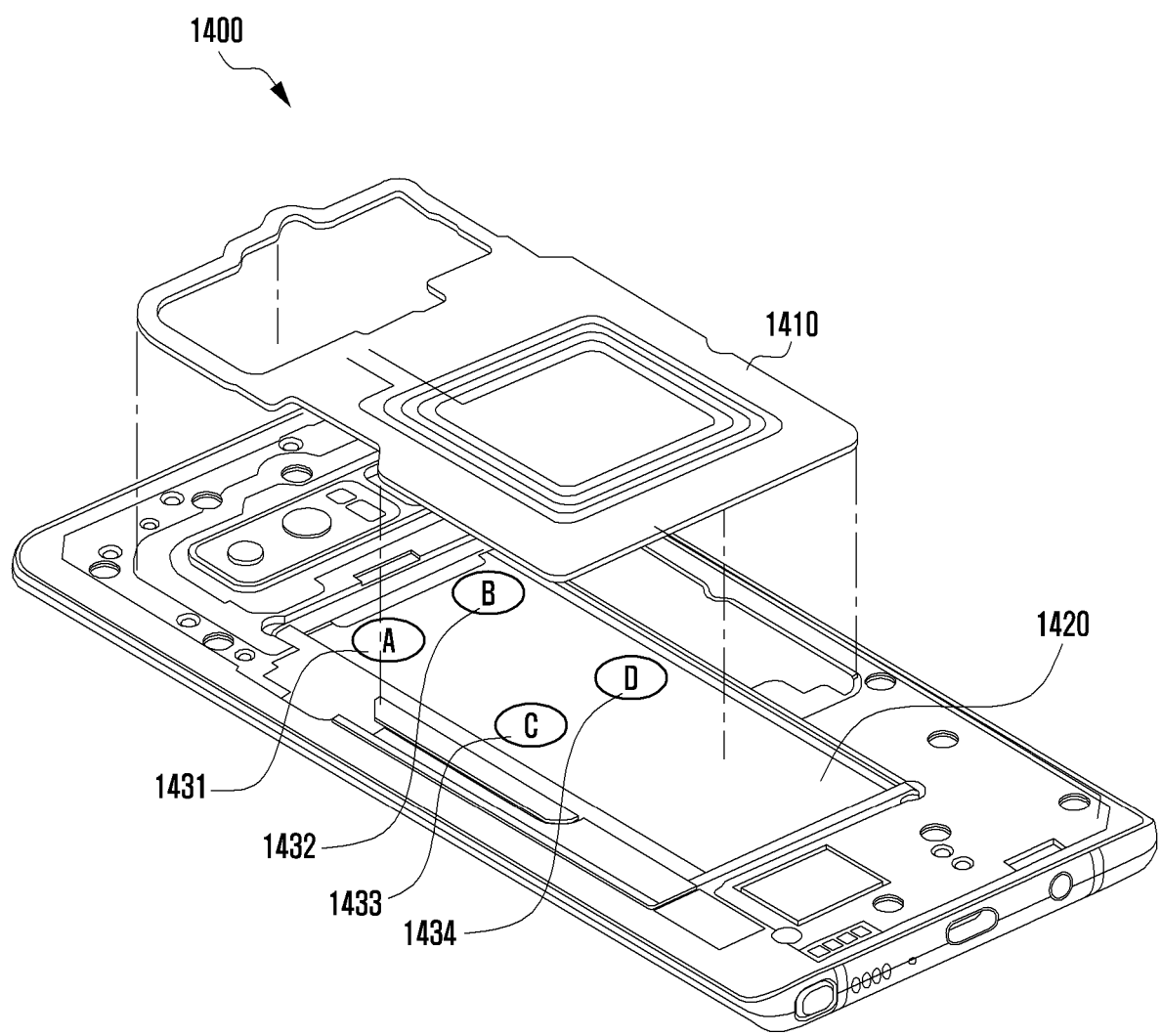
FIG. 14 is a configuration diagram illustrating an electronic device according to another embodiment of the present disclosure.

FIG. 14 is a configuration view illustrating an electronic device according to another embodiment. According to an embodiment, FIG. 14 may be a view illustrating an example in which the cover on the back side of an electronic device 1400 (e.g., 800 in FIG. 8) is separated according to another embodiment.

Referring to FIG. 14, the electronic device 1400 according to another embodiment may include separate antenna modules 1431, 1432, 1433 and 1434 for detecting the battery swelling. For example, the separate antenna modules 1431, 1432, 1433 and 1434 may be positioned to overlap at least a portion of a battery 1420 between a FPCB 1410 on which an NFC antenna (e.g., 840) is mounted and the battery 1420. For example, the separate antenna modules 1431, 1432, 1433 and 1434 may be positioned to overlap a first portion 1431 or a second portion 1432, which is an edge-corner of the battery 1420 as shown as A and B in FIG. 14. Alternatively, the separate antenna modules may be positioned to overlap a third portion 1433, or a fourth portion 1434, which is a portion of one or the other edge of the battery 1420, as shown as C and D in FIG. 14.

TABLE 6

| Loop coil antenna | Resonance frequency (Mhz) for each loop coil antenna | Variation in resonance frequency (Mhz) of NFC antenna |
| --- | --- | --- |
| A | 13.00 | 13.56 −> 13.9 |
| B | 13.15 | 13.56 −> 14.1 |
| C | 13.5 | 13.56 −> 14.35 |
| D | 13.8 | 13.56 −> 14.6 |

Table 6 shows experimental result of frequency variation state of the NFC antenna 840 using a separate antenna, when the separate antenna is additionally installed. Referring to Table 6, the electronic device 1400 may include at least one auxiliary antenna having an impedance value different from each other depending on a position of the battery. According to an embodiment, the at least one auxiliary antenna may be mounted, for example, in a separate FPCB (not shown), and the separate FPCB may include at least one layer in which the auxiliary antenna is formed.

According to an embodiment, the electronic device 1400 may include first to fourth auxiliary antennas 1431, 1432, 1433 and 1434, and each length of the first to fourth auxiliary antennas 1431, 1432, 1433 and 1434 may be different from one another. According to another embodiment of the present disclosure, the first to fourth antennas 1431, 1432, 1433 and 1434 having lengths different from one another may be used to more accurately detect a variation in the frequency of the NFC antenna 840 when the battery is swollen and more accurately detect a position where the battery is swollen.

According to various embodiments, the number of auxiliary antennas 1431, 1432, 1433 and 1434 of the electronic device 1400 is not limited, and may include at least one.

According to an embodiment of the present disclosure, external physical pressure (e.g., battery cover pressed and the like) among external factors varying the phase of the frequency of the antenna may affect to the phase variation of the antenna frequency. However, there is a difference in that the external physical pressure is only partially transmitted to the inductive coil antenna, but the pressure based on the battery swelling is transmitted to the inductive coil antenna as a whole. Therefore, the phase variation of the antenna frequency due to the external pressure is at a very small level, so there is no need to consider in the scope of the present disclosure.

TABLE 7

| Terminal State | Digitized Value at Clock Extractor Unit |
| --- | --- |
| Default (Normal) | 60 |
| on Steel Board | 120 |
| on Reader | 70 |

Table 7 shows the experiments on the phase of the frequency of the antenna influenced by an external substance or device. Referring to Table 7, access to a metal or an external resonator (e.g., an NFC reader), among the external factors varying the phase of the antenna frequency, may be seen to have a significant influence on the antenna frequency variation according to an embodiment of the present disclosure.

However, as shown in Table 7, the metal or the external resonator may vary the frequency phase and raise the phasor value digitized by the NFC IC 810, which thus can be clearly distinguished from the change in the phasor value due to the battery swelling.

According to an embodiment of the present disclosure, the swelling phenomenon of the battery pack may be different in terms of the time of swelling occurrence for each battery pack, however, in general, the swelling occurs gradually.

Accordingly, the electronic device 800 according to an embodiment of the present disclosure may be set to ignore changes in the phase value of the clock signal measured through the clock extractor 815 for a relatively short period of time (e.g., the reference time or less).

TABLE 8

| Terminal Temperature | 55 | 45 | 35 | 25 | 15 | 5 | −5 | −15 |
|---|---|---|---|---|---|---|---|---|
| Digitized Value at Clock Sampler | 51 | 55 | 57 | 60 | 62 | 65 | 68 | 70 |
| Digitized Compensation Value at Clock Sampler Depending on Reference Temperature (25 Degrees) | +9 | +5 | +3 | 0 | −2 | −5 | −8 | −10 |

According to an embodiment of the present disclosure, among the external factors changing the phase of the antenna frequency, an internal temperature of the electronic device 800 may have a significant effect on the change in the phase value of the antenna frequency. As shown in the experimental result of Table 8, the phasor value digitized from the frequency phase at the clock extracting unit 815 may be seen to be greatly affected by a temperature change. Thus, according to an embodiment of the present disclosure, the electronic device 800 may store a temperature compensation table to compensate for the phasor value depending on the internal temperature. For example, the electronic device 800 may correct the frequency phase at the clock extractor 815 referring to the temperature compensation table. Various embodiments of the present disclosure may more accurately detect the battery swelling by compensating for a change in the antenna frequency phase value depending on a temperature variation.

With regard to a method of an electronic device 500 for detecting a swelling of the battery 540 according to various embodiments of the present disclosure, the electronic device 500 may include a housing (e.g., 320) including a front plate (e.g., 310) and a back plate (e.g., 330) facing away from and spaced from the front plate 310, a battery (e.g., 540) including a first surface facing the front plate 310 and a second surface facing the back plate 330, a first layer including a conductive pattern (e.g., 552) parallel to the back plate 330, a second layer interposed between the first layer and the second surface of the battery 540, a third layer interposed between and contacting the first layer and the second layer, and a circuit (e.g., 710) electrically connected to a first point (e.g., Tx1 in FIG. 7) and a second point (e.g., Tx2 in FIG. 7) of the conductive pattern 552, and configured to transmit a signal to the first point Tx1 and receive the signal from the second point Tx2, and the method may include the following operations performed by the circuit 710: comparing a phase of a signal transmitted to the first point Tx1 with the phase of the signal received from the second point Tx2, and determining whether the battery 540 is swollen based on the phase difference. The conductive pattern 552 may include a coil wound around an axis perpendicular to the first layer. The circuit 710 may also be configured to transmit and/or receive at least one of a magnetic signal, an NFC signal, or a wireless charging signal, using the conductive pattern 552. The method may include the following operations performed by the circuit 710: generating a n-bit digital value based on a result of comparing a phase of a signal transmitted to the first point Tx1 with the phase of the signal received from the second point Tx2; calculating a phasor value from the n-bit digital value; and determining that the battery 540 is swollen when the calculated phasor value is different from a pre-stored reference phasor value. With regard to the method, the circuit 710 may perform an operation allowing the display to indicate a request for checking the swelling of the battery 540 when the battery 540 is determined to have been swollen. The reference phasor value may be the phasor value calculated by driving the circuit 710 when the battery 540 is in a normal state. With regard to the method, the circuit 710 may further perform the following operations: checking whether a display of the electronic device 500 is on or off, and terminating a drive when the display of the electronic device 500 is an off state. With regard to the method, the circuit 710 may further perform the following operations: detecting a temperature of the electronic device 500, and correcting the phase of the signal received from the second point Tx2 based on the temperature of the electronic device 500, when the temperature of the electronic device 500 is out of a reference range.

With regard to a recording medium, wherein a program for controlling an operation of an electronic device 500 according to various embodiments of the present disclosure is recorded, the electronic device 500 may include a housing (e.g., 320) including a front plate (e.g., 310) and a back plate (e.g., 330) facing away from and spaced from the front plate 310, a battery (e.g., 540) including a first surface facing the front plate 310 and a second surface facing the back plate 330, a first layer including a conductive pattern (e.g., 552) parallel to the back plate 330, a second layer interposed between the first layer and the second surface of the battery 540, a third layer interposed between and contacting the first layer and the second layer, and a circuit (e.g., 710) electrically connected to a first point (e.g., Tx1 in FIG. 7) and a second point (e.g., Tx2 in FIG. 7) of the conductive pattern 552, and configured to transmit a signal to the first point Tx1 and receive the signal from the second point Tx2, and the recording medium may be recorded with a program which allows the circuit 710 to perform the following operations: comparing a phase of a signal transmitted to the first point Tx1 with the phase of the signal received from the second point Tx2; and determining whether the battery 540 is swollen based on the phase difference.

The recording medium may be further recorded with a program which allows the circuit 710 to perform the following operations: generating a n-bit digital value based on a result of comparing a phase of a signal transmitted to the first point Tx1 with the phase of the signal received from the second point Tx2; calculating a phasor value from the n-bit digital value; and determining that the battery 540 is swollen when the calculated phasor value is different from a pre-stored reference phasor value.

Figure 15:
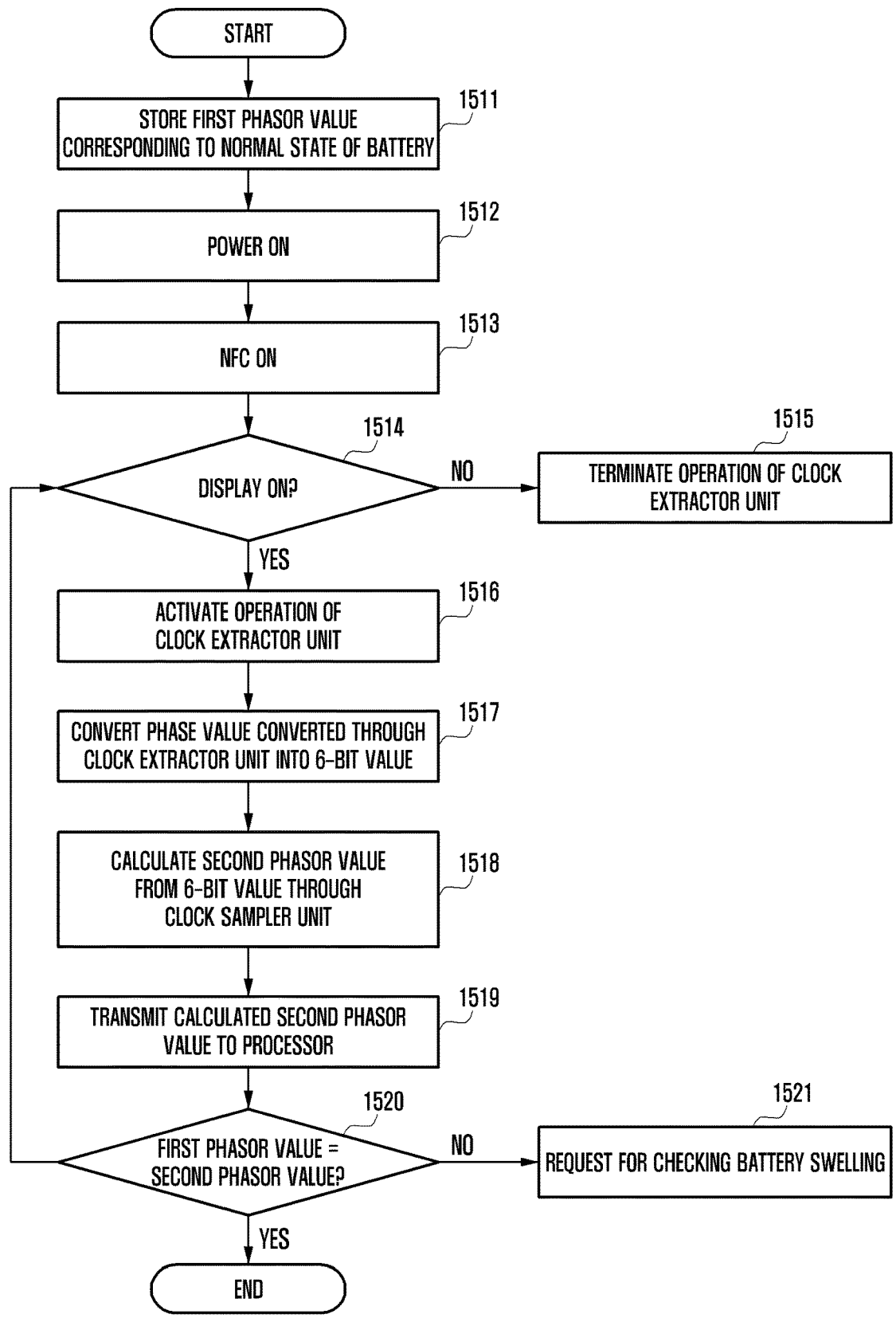
FIG. 15 is a flowchart illustrating an operation of the electronic device according to an embodiment of the present disclosure.

FIG. 15 is a flowchart illustrating an operation of the electronic device according to an embodiment of the present disclosure.

In an operation 1511, for example, the application processor 820 of the electronic device (e.g., 800) may store in the memory a first phasor value corresponding to the normal state of the battery. For example, the electronic device 800 of the present disclosure may store the first phasor value when the battery is in a normal state after completing a product assembly and before shipment. For example, the first phasor value may be a value digitized from the 6-bit code value calculated by driving the clock extractor (e.g., 815) of the NFC IC (e.g., 810) and the clock sampler (e.g., 816) by the application processor 820 before the shipment of the electronic device 800. According to an embodiment, the application processor 820 may store the first phasor value as a reference value in memory after completing product assembly and before shipment.

In operations 1512 and 1513, for example, the application processor 820 of the electronic device 800 may power on the electronic device 800 based on user input and turn on the NFC function.

In an operation 1514, for example, the application processor 820 of the electronic device 800 may check whether the display (e.g., 160) is on.

According to an embodiment, the application processor 820 may perform the operation 1515 when the display 160 is off and perform an operation 1516 when the display 160 is on.

In an operation 1515, for example, the application processor 820 of the electronic device 800 may terminate the operations of the clock extractor 815 and the clock sampler 816 when the display 160 is off. According to an embodiment, the application processor 820 of the electronic device 800 may set the NFC function to a low power mode when the display 160 is off. According to an embodiment, when the NFC IC (e.g., 810) is set to the low power mode, the operations of the clock extractor 815 and the clock sampler 816 may be deactivated.

In the operation 1516, for example, the application processor 820 of the electronic device 800 may activate the operations of the clock extractor 815 and the clock sampler 816 when the display 160 is on. According to an embodiment, the application processor 820 of the electronic device 800 may set the NFC function to a full power mode (or a normal mode) when the display 160 is on. According to an embodiment, when the NFC IC (e.g., 810) is set to the full power mode (or the normal mode), the operations of the clock extractor 815 and the clock sampler 816 may be activated and the change in the phase of the clock signal may be checked.

In an operation 1517, for example, the application processor 820 of the electronic device 800 may convert the phase value converted through the clock extractor 815 and the clock sampler 816 to the 6-bit value. For example, the clock extractor 815 may convert the clock signal received through the NFC antenna 840 into the digital signal. For example, the clock extractor 815 may recover a clock signal having a frequency of about 13.56 MHz, which is a frequency corresponding to the NFC communication, into the digital clock signal. According to an embodiment, the clock extractor 815 may provide the converted digital signal to the clock sampler 816. According to an embodiment, the clock sampler 816 may compare the clock signal received from the clock generator with the clock signal received through the NFC antenna 840 (i.e., the digital signal received from the clock extractor 815) and generate a digital value of a specific bit (e.g., 6 bits) based on the comparison result.

In an operation 1518, for example, the application processor 820 of the electronic device 800 may calculate the second phasor value from the 6-bit value using the clock sampler 816. For example, the application processor 820 may calculate the 6-bit code provided from the clock sampler 816 in a range of 0 to 120. According to an embodiment, the sampling unit of the clock sampler 816 may be about 1.5 nsec, and the sampling time may be correctable. For example, the reference value when the resonance frequency is 13.56 MHz may be set to 60. According to an embodiment, the electronic device 800 may calculate the phasor value by adding (bit number*10) to the reference value 60 when the phase leads (i.e., the resonance frequency is high), as shown in Equation 1. According to an embodiment, the electronic device 800 may calculate the phasor value by subtracting (bit number*10) from the reference value 60 when the phase lags (i.e., the resonance frequency is low), as shown in Equation 2. According to various embodiments, the application processor 820 may determine that a circuit operation of the NFC IC 810 is abnormal when the Bit pattern is not continuous, and control the operation of the NFC IC 810 to be reset.

In an operation 1519, for example, the clock sampler 816 of the NFC IC 810 may transmit the calculated second phasor value to the application processor 820. According to a certain embodiment, the second phasor value may be directly calculated in the application processor 820 rather than at the clock sampler 816, in which case the operation 1519 may be omitted.

In an operation 1520, for example, the application processor 820 of the electronic device 800 may check whether the first phasor value and the second phasor value, which are pre-stored in the memory, are equal, respectively. According to an embodiment, the application processor 820 may perform an operation 1521 when the first phasor value and the second phasor value are different from each other.

In the operation 1521, for example, the application processor 820 of the electronic device 800 may request for checking the battery swelling when the first phasor value and the second phasor value are different from each other. For example, the application processor 820 may output (provide) a user interface informing that the battery is swollen through the display 160. According to a certain embodiment, the electronic device 800 may determine the degree of the battery swelling depending on the degree of difference between the measured first and second phasor values, and provide functions related to battery charge differently depending on the degree of the battery swelling. For example, the electronic device 800 may determine that the degree of the battery swelling is relatively small when the difference value is relatively small, thereby limiting the maximum charge amount of the battery to about 80% or less. Alternatively, the electronic device 800 may determine that the degree of the battery swelling is relatively great when the difference value is relatively great, thereby limiting the maximum charge amount of the battery to about 30% or less. In the above, the numerical value for limiting the maximum charge amount of about 80% or about 30% is only an example, and is not limited thereto. According to a certain embodiment, the electronic device 800 may limit the battery charge function when the difference value exceeds the pre-stored threshold value, forcibly discharge the charge charged in the battery, or forcibly terminate the power supply of the electronic device 800. According to a certain embodiment, the electronic device 800 may limit functions associated with the battery charge when the first phasor value and the second phasor value are different from each other. For example, the electronic device 800 may limit the maximum charge amount of the battery, or forcefully discharge the charge charged in the battery.

Figure 16:
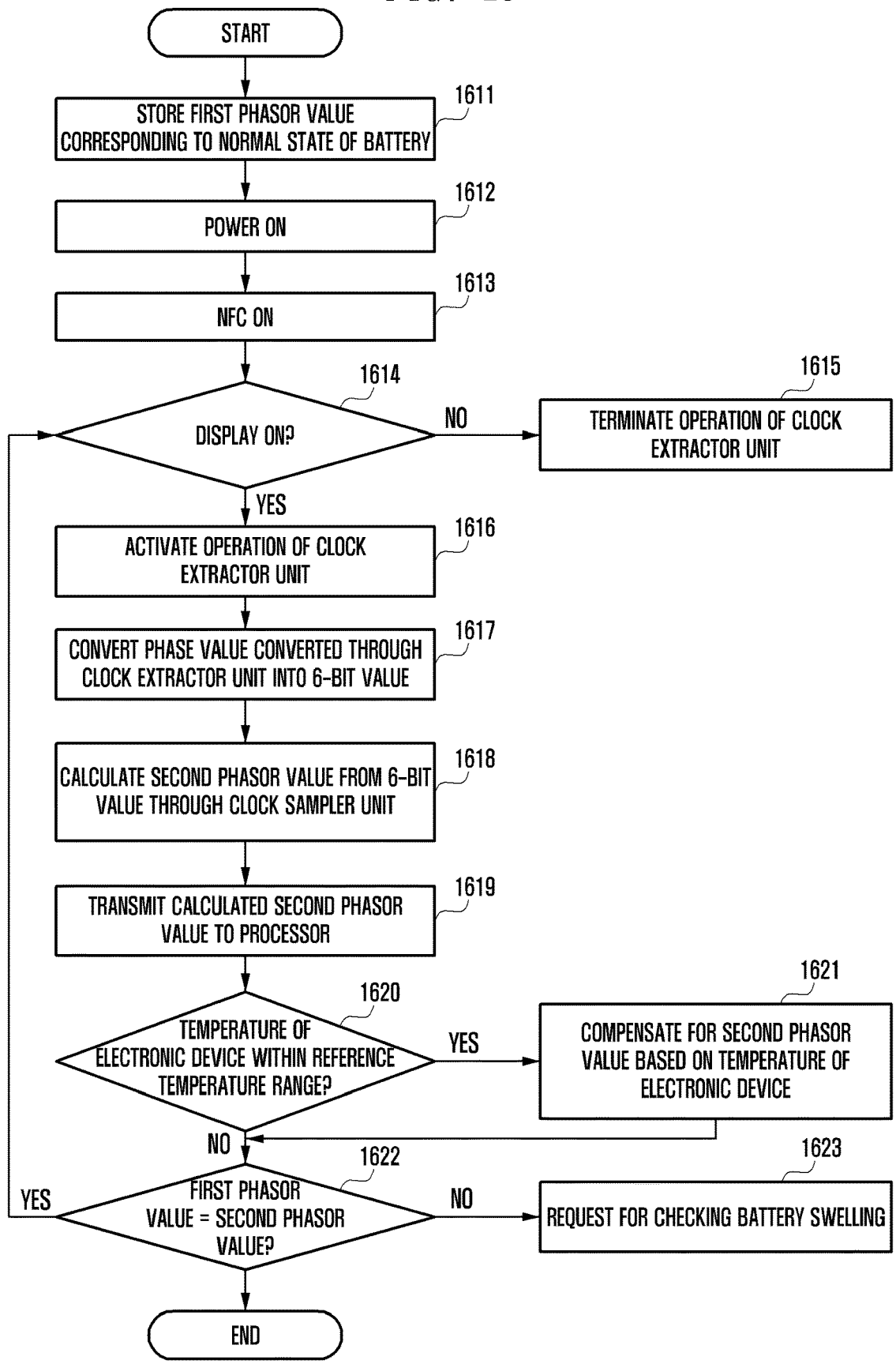
FIG. 16 is a flowchart illustrating an operation of the electronic device according to another embodiment of the present disclosure.

FIG. 16 is a flowchart illustrating an operation of the electronic device according to another embodiment of the present disclosure.

Referring to FIG. 16, operations 1611 to 1619 may be the same as or similar to the operations 1511 to 1519 shown in FIG. 15, therefore, only the operations different from those in FIG. 16 will be described as below.

In an operation 1620, for example, a processor (e.g., 820) of an electronic device (e.g., 800) may check whether the internal temperature of the electronic device 800 corresponds to a reference temperature range. For example, the reference temperature may be in the range of 20° C. to 25° C., which is room temperature, and the application processor 820 may measure the internal temperature through the sensor unit of the electronic device 800 and check whether the measured internal temperature falls within the range. According to an embodiment, the application processor 820 may perform an operation 1621 when the internal temperature of the electronic device 800 is out of a reference range and perform an operation 1622 when the internal temperature of the electronic device 800 is within the reference range.

In the operation 1621, for example, the application processor 820 of the electronic device 800 may compensate for the second phasor value based on a temperature of the electronic device 800. For example, the electronic device 800 may store the temperature compensation table to compensate for the phasor value depending on the internal temperature. For example, the application processor 820 may correct the frequency phase in the clock extractor (e.g., 815) referring to the temperature compensation table. Various embodiments of the present disclosure may more accurately detect the battery swelling by compensating for a change in the phase value of the antenna frequency due to the temperature variations.

In the operation 1622, for example, the application processor 820 of the electronic device 800 may check whether the first phasor value and the second phasor value, which are stored in memory in advance, are equal, respectively. According to an embodiment, the application processor 820 may perform the operation 1521 when the first phasor value and the second phasor value are different from each other.

In an operation 1623, for example, the application processor 820 of the electronic device 800 may request for checking the battery swelling when the first phasor value and the second phasor value are different from each other. For example, the application processor 820 may output (provide) a user interface informing that the battery is swollen through the display 160. According to a certain embodiment, the electronic device 800 may determine the degree of the battery swelling depending on the degree of the difference between the measured first and second phasor values, and provide functions related to the battery charge differently depending on the degree of the battery swelling. For example, the electronic device 800 may determine that the degree of the battery swelling is relatively small when the difference value is relatively small, thereby limiting the maximum charge amount of the battery to about 80% or less. Alternatively, the electronic device 800 may determine that the degree of the battery swelling is relatively great when the difference value is relatively great, thereby limiting the maximum charge amount of the battery to about 30% or less.

In the above, the numerical value for limiting the maximum charge amount of about 80% or about 30% is only an example, and is not limited thereto. According to a certain embodiment, the electronic device 800 may limit the charging function of the battery when the difference value exceeds the pre-stored threshold value, forcibly discharge the charge charged in the battery, or forcibly terminate the power supply of the electronic device 800. According to a certain embodiment, the electronic device 800 may limit functions associated with the battery charge when the first phasor value and the second phasor value are different from each other. For example, the electronic device 800 may limit the maximum charge amount of the battery, or forcefully discharge the charge charged in the battery.

As described above, various embodiments of the present disclosure may detect the battery swelling in advance and thereby, prevent safety accidents due to ignition, explosion, etc. of the battery pack.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, or hardware programmed with software, and may interchangeably be used with other terms, for example, "logic," "logic block," "part," or "circuitry", A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

What is claimed is:

1. An electronic device comprising:
   a housing including a front plate, and a back plate facing away from and spaced from the front plate;
   a battery including a first surface facing the front plate and a second surface facing the back plate;
   a first layer comprising:
      a conductive pattern parallel to the back plate, wherein at least a portion of the conductive pattern is interposed between the second surface of the battery and the back plate;
      a circuit electrically connected to a first point and a second point of the conductive pattern, and configured to transmit a signal to the first point and receive a signal from the second point; and further configured to:
         detect a phase difference between the transmitted signal and the received signal, and
         determine whether the battery is swollen, based on the phase difference.

2. The device of claim 1, wherein the conductive pattern includes a coil wound around an axis perpendicular to the first layer.

3. The device of claim 2, wherein the circuit is also configured to transmit and/or receive at least one of a magnetic signal, a near field communication (NFC) signal, or a wireless charging signal, using the conductive pattern.

4. The device of claim 1, wherein the first layer includes a flexible printed circuit board (FPCB).

5. The device of claim 4, further comprising:
   a second layer interposed between the first layer and the second surface of the battery, wherein the second layer includes graphite.

6. The device of claim 5, further comprising:
   a third layer interposed between and contacting the first layer and the second layer, wherein the third layer includes a compound including iron (Fe).

7. The device of claim 1, wherein the conductive pattern is positioned to overlap the battery.

8. The device of claim 1, wherein the circuit generates a n-bit digital value based on a result of comparing a phase of the signal transmitted to the first point with a phase of the signal received from the second point;
   calculates a phasor value from the n-bit digital value; and
   determines that the battery is swollen when the calculated phasor value is different from a pre-stored reference phasor value.

9. The device of claim 1, wherein the circuit terminates a drive when a display of the electronic device is an off state.

10. The device of claim 1, wherein the circuit detects a temperature of the electronic device, and corrects a phase of the signal received from the second point based on the temperature of the electronic device, when the temperature of the electronic device is out of a reference range.

11. A method of an electronic device for detecting a battery swelling, the electronic device including a housing including a front plate and a back plate facing away from and spaced from the front plate, a battery including a first surface facing the front plate and a second surface facing the back plate, a first layer including a conductive pattern parallel to the back plate, wherein at least a portion of the conductive pattern is interposed between the second surface of the battery and the back plate, and a circuit electrically connected to a first point and a second point of the conductive pattern and configured to transmit a signal to the first point and receive a signal from the second point, the method comprising:
   comparing a phase of the signal transmitted to the first point with a phase of the signal received from the second point; and
   determining whether the battery is swollen based on a phase difference between the phase of the signal transmitted to the first point and the phase of the signal received from the second point.

12. The method of claim 11, wherein the conductive pattern includes a coil wound around an axis perpendicular to the first layer.

13. The method of claim 12, wherein the circuit is also configured to transmit and/or receive at least one of a magnetic signal, an NFC signal, or a wireless charging signal, using the conductive pattern.

14. The method of claim 11, wherein the circuit performs the following operations:
generating a n-bit digital value based on a result of comparing the phase of the signal transmitted to the first point with the phase of the signal received from the second point;
calculating a phasor value from the n-bit digital value; and
determining that the battery is swollen when the calculated phasor value is different from a pre-stored reference phasor value.

15. The method of claim 14, wherein the circuit performs an operation allowing a display to indicate a request for checking the battery swelling when the battery is determined to have be swollen.

16. The method of claim 14, wherein the reference phasor value is the phasor value calculated by driving the circuit when the battery is in a normal state.

17. The method of claim 11, wherein the circuit performs the following operations:
checking whether a display of the electronic device is on or off, and
terminating a drive when the display of the electronic device is an off state.

18. The method of claim 11, wherein the circuit performs the following operations:
detecting a temperature of the electronic device; and
correcting the phase of the signal received from the second point based on the temperature of the electronic device, when the temperature of the electronic device is out of a reference range.

19. A non-transitory recording medium, wherein a program for controlling an operation of an electronic device is recorded, the electronic device including a housing including a front plate and a back plate facing away from and spaced from the front plate, a battery including a first surface facing the front plate and a second surface facing the back plate, a first layer including a conductive pattern parallel to the back plate, wherein at least a portion of the conductive pattern is interposed between the second surface of the battery and the back plate, and a circuit electrically connected to a first point and a second point of the conductive pattern and configured to transmit a signal to the first point and receive a signal from the second point, the non-transitory recording medium storing a program which allows the circuit to perform the following operations:
comparing a phase of the signal transmitted to the first point with a phase of the signal received from the second point; and
determining whether the battery is swollen based on a phase difference between the phase of the signal transmitted to the first point and the phase of the signal received from the second point.

20. The non-transitory recording medium of claim 19, wherein the non-transitory recording medium is further recorded with a program which allows the circuit to perform the following operations:
generating a n-bit digital value based on a result of comparing the phase of the signal transmitted to the first point with the phase of the signal received from the second point;
calculating a phasor value from the n-bit digital value; and
determining that the battery is swollen when the calculated phasor value is different from a pre-stored reference phasor value.

* * * * *